(12) United States Patent
Hung et al.

(10) Patent No.: US 11,966,170 B2
(45) Date of Patent: *Apr. 23, 2024

(54) LITHOGRAPHIC OVERLAY CORRECTION AND LITHOGRAPHIC PROCESS

(71) Applicant: TAIWAN SEMICONDUCTOR MANUFACTURING COMPANY LTD., Hsinchu (TW)

(72) Inventors: Ai-Jen Hung, Nantou County (TW); Yung-Yao Lee, Hsinchu County (TW); Heng-Hsin Liu, New Taipei (TW); Chin-Chen Wang, Hsinchu (TW); Ying Ying Wang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 759 days.

This patent is subject to a terminal disclaimer.

(21) Appl. No.: 17/081,800

(22) Filed: Oct. 27, 2020

(65) Prior Publication Data

US 2021/0041792 A1 Feb. 11, 2021

Related U.S. Application Data

(62) Division of application No. 15/992,000, filed on May 29, 2018, now Pat. No. 10,831,110.

(51) Int. Cl.
*G03F 7/20* (2006.01)
*G03F 7/00* (2006.01)
(Continued)

(52) U.S. Cl.
CPC ...... *G03F 7/70633* (2013.01); *G03F 7/70775* (2013.01); *G03F 7/70783* (2013.01);
(Continued)

(58) Field of Classification Search
CPC ............. G03F 7/70633; G03F 7/70775; G03F 7/70783; G03F 9/7003; G03F 9/7046;
(Continued)

(56) References Cited

U.S. PATENT DOCUMENTS

| 8,711,329 | B2 * | 4/2014 | Van Kemenade | G03F 7/70633 355/53 |
| 2012/0164854 | A1 * | 6/2012 | Wang | H05K 3/4007 29/829 |

(Continued)

FOREIGN PATENT DOCUMENTS

CN 106483770 B * 8/2018

OTHER PUBLICATIONS

Kubis et al. Reducing the impact of etch-induced pattern shift on overlay by using lithography and etch tool corrections (Year: 2017).*

(Continued)

*Primary Examiner* — Eyob Hagos
(74) *Attorney, Agent, or Firm* — WPAT LAW; Anthony King

(57) ABSTRACT

A method includes receiving a wafer, measuring a surface topography of the wafer; calculating a topographical variation based on the surface topography measurement performing a single-zone alignment compensation when the topographical variation is less than a predetermined value or performing a multi-zone alignment compensation when the topographical variation is greater than the predetermined value; and performing a wafer alignment according to the single-zone alignment compensation or the multi-zone alignment compensation.

20 Claims, 16 Drawing Sheets

(51) Int. Cl.
*G03F 9/00* (2006.01)
*H01L 21/68* (2006.01)

(52) U.S. Cl.
CPC .......... *G03F 9/7003* (2013.01); *G03F 9/7046* (2013.01); *G03F 9/7073* (2013.01); *G03F 9/7088* (2013.01); *H01L 21/682* (2013.01)

(58) Field of Classification Search
CPC .... G03F 9/7073; G03F 9/7088; G03F 9/7049; H01L 21/682
See application file for complete search history.

(56) References Cited

U.S. PATENT DOCUMENTS

| | | | | |
|---|---|---|---|---|
| 2013/0090877 | A1* | 4/2013 | Nagai | G03F 7/70633 702/95 |
| 2013/0258306 | A1* | 10/2013 | Huang | G03F 9/7049 356/399 |
| 2015/0015870 | A1* | 1/2015 | Lin | H01L 22/20 356/612 |
| 2015/0016943 | A1* | 1/2015 | Hsieh | H01L 22/20 414/816 |
| 2015/0324965 | A1* | 11/2015 | Kulkarni | G06T 7/001 382/144 |
| 2016/0378904 | A1* | 12/2016 | Greco | G03F 7/70633 716/51 |
| 2017/0309009 | A1* | 10/2017 | Haque | H01L 22/12 |
| 2020/0326640 | A1* | 10/2020 | Tzemah | G03F 9/7019 |
| 2021/0241999 | A1* | 8/2021 | Wu | H01L 21/32051 |

OTHER PUBLICATIONS

Castenmiller et al. "Towards ultimate optical lithography with NXT:1950i dual stage immersion platform" (Year: 2010).*

* cited by examiner

LITHOGRAPHIC OVERLAY CORRECTION AND LITHOGRAPHIC PROCESS

PRIORITY CLAIM AND CROSS-REFERENCE

This application is a divisional application of U.S. patent application Ser. No. 15/992,000 filed on May 29, 2018, entitled of "LITHOGRAPHIC OVERLAY CORRECTION AND LITHOGRAPHIC PROCESS", which is incorporated by reference in its entirety.

BACKGROUND

The semiconductor integrated circuit (IC) industry has experienced exponential growth. Technological advances in IC materials and design have produced generations of ICs where each generation comprises smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. Such reduction in scale generally provides benefits by increasing production efficiency and reducing associated costs.

However, such reduction in scale has also increased the complexity of processing and IC manufacturing. For example, it is more difficult to reduce the overlay errors induced in lithography patterning using advanced lithography technologies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
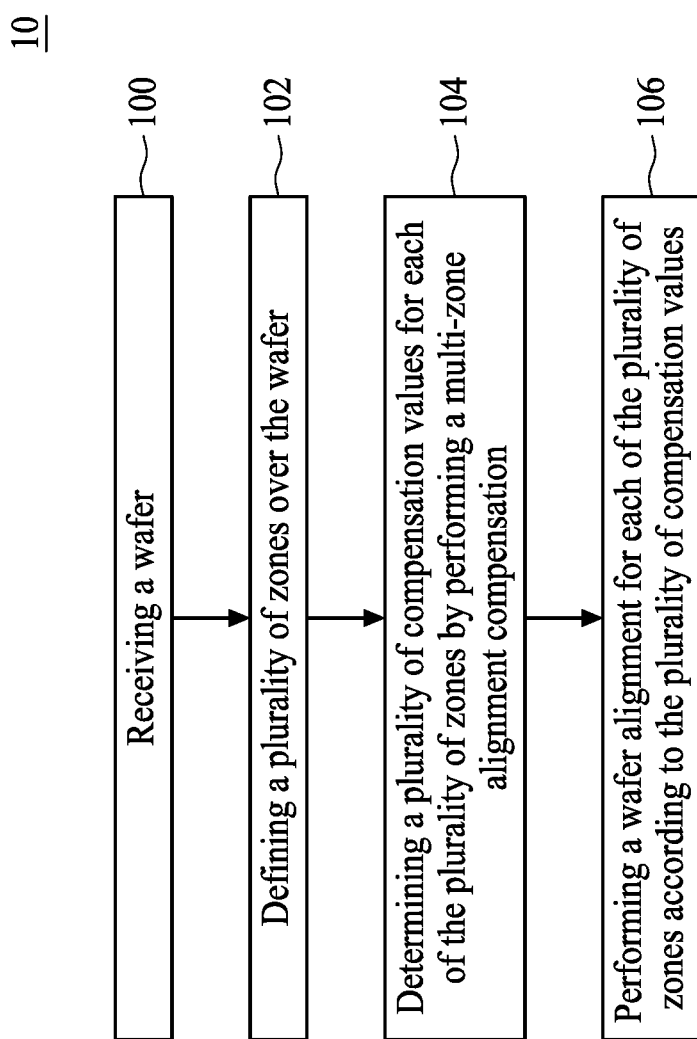
FIG. 1 is a flow chart representing a lithography overlay correction method according to aspects of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Silicon wafers are manufactured in a sequence of successive lithography steps including mask alignment, lithography exposure, photoresist development, layer etch, and layer growth or deposition to form a pattern which defines device structures within an IC. In order for the ICs to operate correctly, these patterns in successive layers must be aligned accurately with each other. Misalignment between the layers including the patterns may cause short circuits or connection failures which significantly impact device yield. Further, alignment between patterns is based on forming the patterns accurately, and thus mask alignment in relation to a wafer in a manufacturing process is important.

To facilitate mask alignment, dedicated alignment structures are placed and utilized to achieve overlay (OVL) control, or to ensure OVL accuracy (i.e., reduce alignment residual). However, effects such as thermal cycling of the wafer during IC manufacturing can distort an ideally flat wafer surface and form wafer topography which may degrade OVL control by distorting the alignment structures or shifting alignment structures from their designated locations while aligning to a surface of the wafer. In some embodiments, linear model compensation can be performed to compensate for such deviations. However, it has been observed that topography induces degradation of overlay, and high overlay variation is obtained even when the linear model compensation is performed.

The present disclosure therefore provides a lithographic overlay correction method and lithography process that is able to mitigate overlay variation and improve wafer alignment. Consequently, overlay between successive layers is improved.

FIG. 1 is a flow chart representing a lithographic overlay correction method 10 according to aspects of the present disclosure. The method 10 includes an operation 100: receiving a wafer. The method 10 further includes an operation 102: defining a plurality of zones over the wafer. In some embodiments, each of the plurality of zones includes a plurality of fields. The method 10 further includes an operation 104: determining a plurality of compensation values for each of the plurality of zones by performing a multi-zone alignment compensation according to an equation. The method 10 further includes an operation 106: performing a wafer alignment for each of the plurality of zones according to the plurality of compensation values. The method 10 will be further described according to one or more embodiments. It should be noted that the operations of the method 10 may be rearranged or otherwise modified within the scope of the various aspects. It should further be noted that additional processes may be provided before, during, and after the method 10, and that some other processes may only be briefly described herein. Thus, other implementations are possible within the scope of the various aspects described herein.

Figure 2:
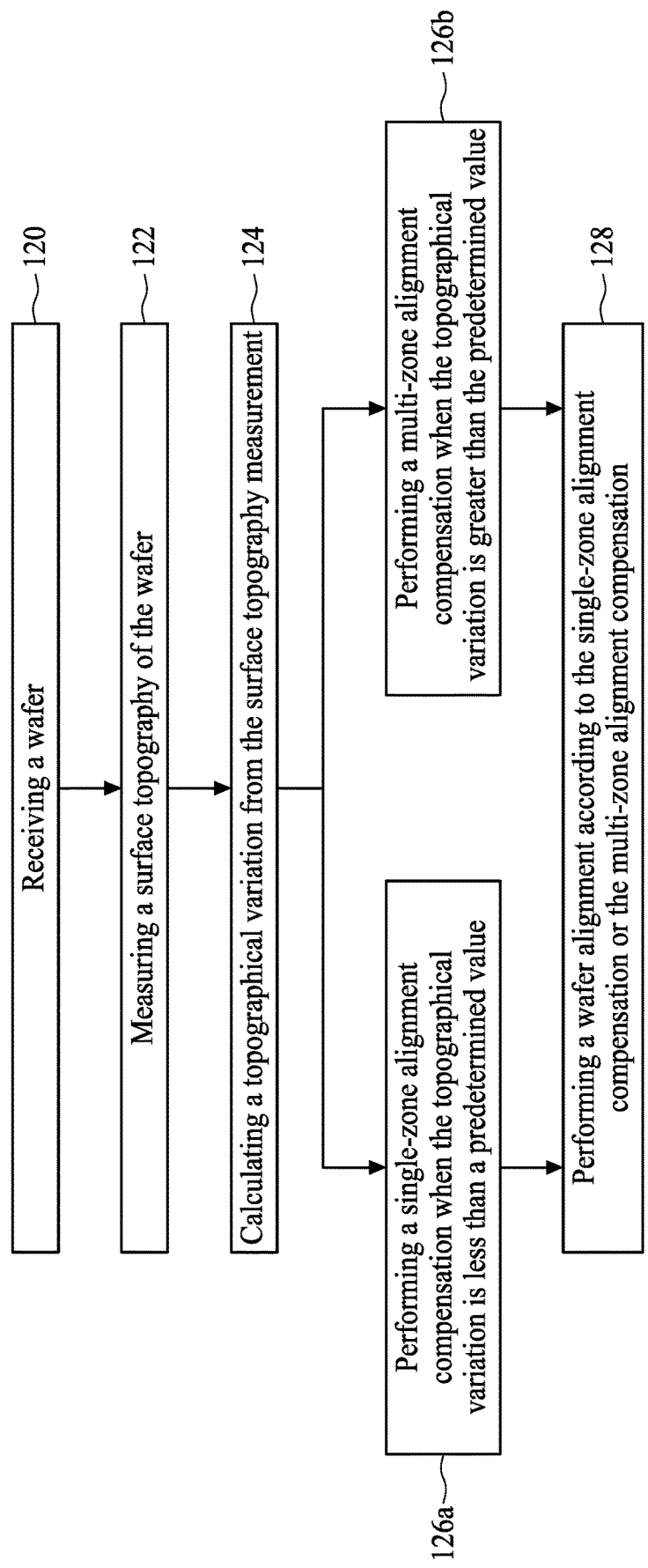
FIG. 2 is a flow chart representing a lithography overlay correction method according to aspects of the present disclosure.

FIG. 2 is a flow chart representing a lithographic overlay correction method 12 according to aspects of the present disclosure. The method 12 includes an operation 120: receiving a wafer. The method 12 further includes an operation 122: measuring a surface topography of the wafer. The method 12 further includes an operation 124: calculating a topographical variation from the surface topography measurement. The method 12 further includes an operation 26a: performing a single-zone alignment compensation when the topographical variation is less than a predetermined value. The method 12 further includes an operation 126b: performing a multi-zone alignment compensation when the topographical variation is greater than the predetermined value. The method 12 further includes an operation 128: performing a wafer alignment according to the single-zone alignment compensation or the multi-zone alignment compensation. The method 12 will be further described according to one or more embodiments. It should be noted that the operations of the method 12 may be rearranged or otherwise modified within the scope of the various aspects. It should further be noted that additional processes may be provided before, during, and after the method 12, and that some other processes may only be briefly described herein. Thus, other implementations are possible within the scope of the various aspects described herein.

Figure 3:
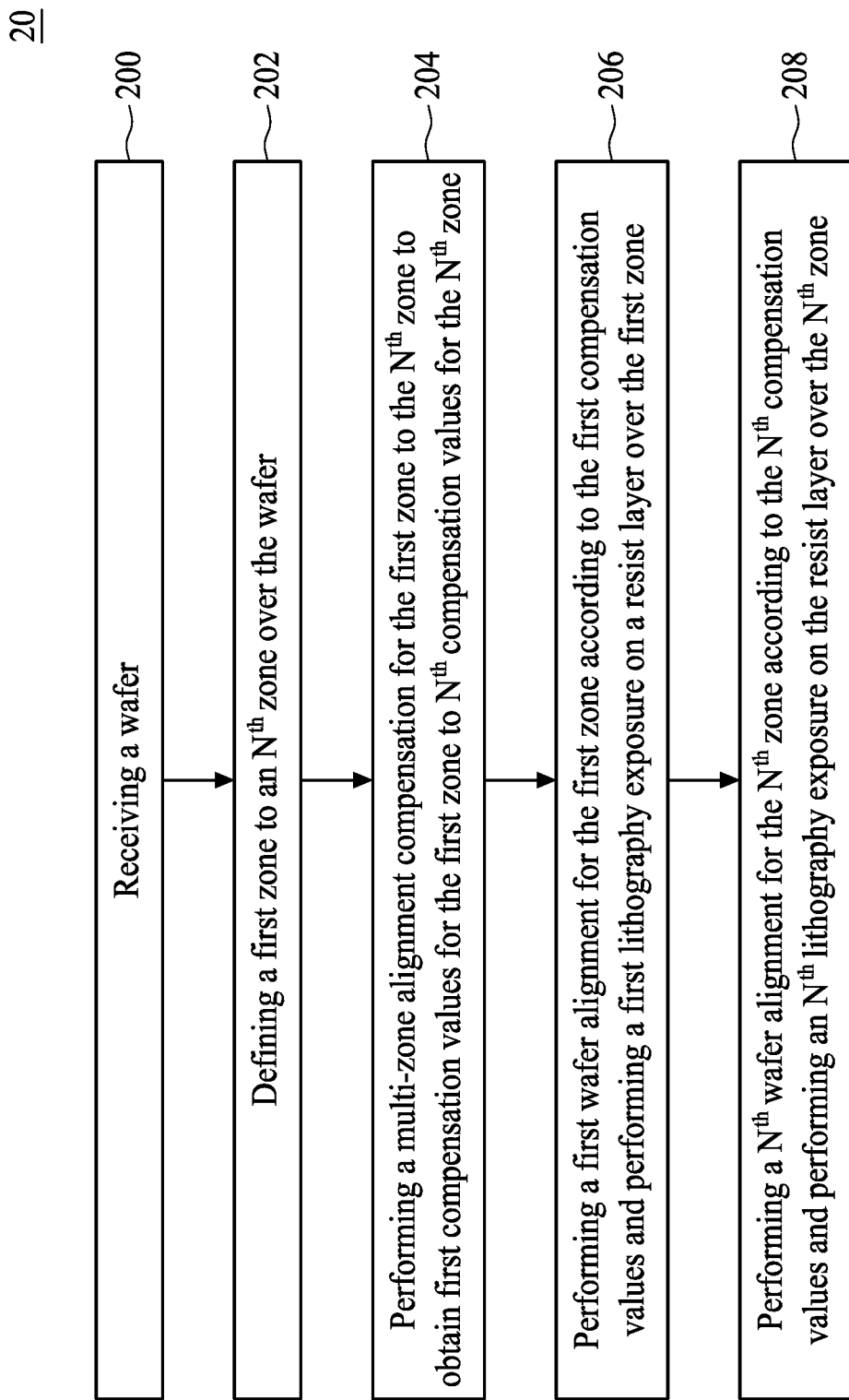
FIG. 3 is a flow chart representing a lithography operation according to aspects of the present disclosure.

FIG. 3 is a flow chart representing a method 20 according to aspects of the present disclosure. The method 20 includes an operation 200: receiving a wafer. The method 20 further includes an operation 202: defining a first zone to an $N^{th}$ zone over the wafer. The method 20 further includes an operation 204: performing a multi-zone alignment compensation for the first zone to the $N^{th}$ zone to obtain a first compensation value for the first zone to an $N^{th}$ compensation value for the $N^{th}$ zone. The method 20 further includes an operation 206: performing a first wafer alignment for the first zone according to the first compensation value and performing a first lithography exposure to a resist layer over the first zone. In some embodiments, the wafer alignment and the lithography exposure are performed zone-by-zone from the first zone to the $N^{th}$ zone. Therefore, the method 20 further includes an operation 208: performing an $N^{th}$ wafer alignment for the $N^{th}$ zone according to the $N^{th}$ compensation value and performing an $N^{th}$ lithography exposure to the resist layer over the $N^{th}$ zone. The method 20 will be further described according to one or more embodiments. It should be noted that the operations of the method 20 may be rearranged or otherwise modified within the scope of the various aspects. It should further be noted that additional processes may be provided before, during, and after the method 20, and that some other processes may only be briefly described herein. Thus, other implementations are possible within the scope of the various aspects described herein.

Figure 4:
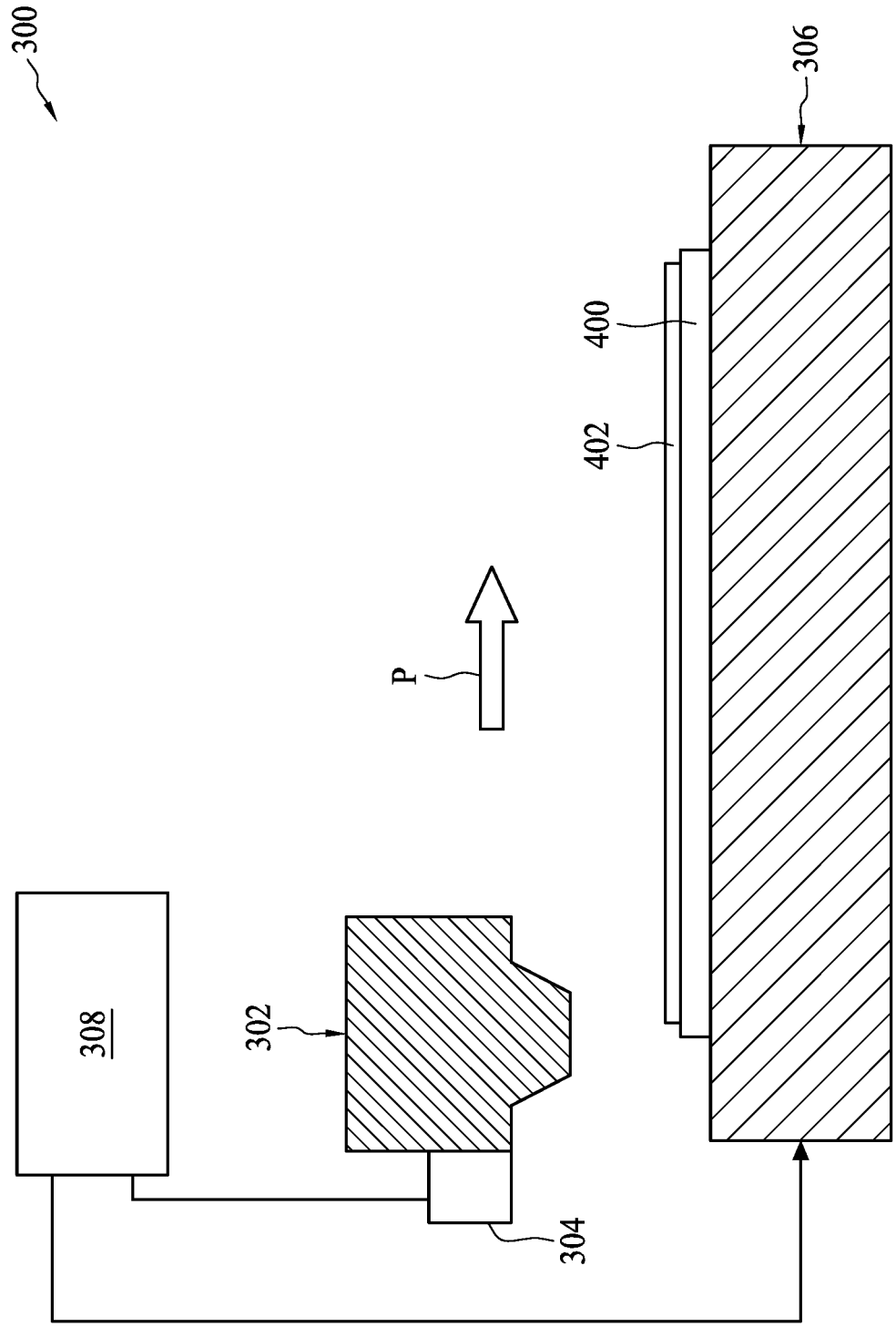
FIG. 4 is a schematic side view of a lithography exposure system in accordance with some embodiments.

FIG. 4 is a schematic side view of a lithography exposure system 300 in accordance with some embodiments. The lithography exposure system 300 includes an exposure apparatus 302, an alignment apparatus 304, a single wafer stage 306, and a controller 308. In some embodiments, the exposure apparatus 302 and the alignment apparatus 304 may have the same scan path P. A wafer 400 is received according to operation 100, 120 or 200, and the wafer 400 is disposed on the single wafer stage 306.

Figure 5:
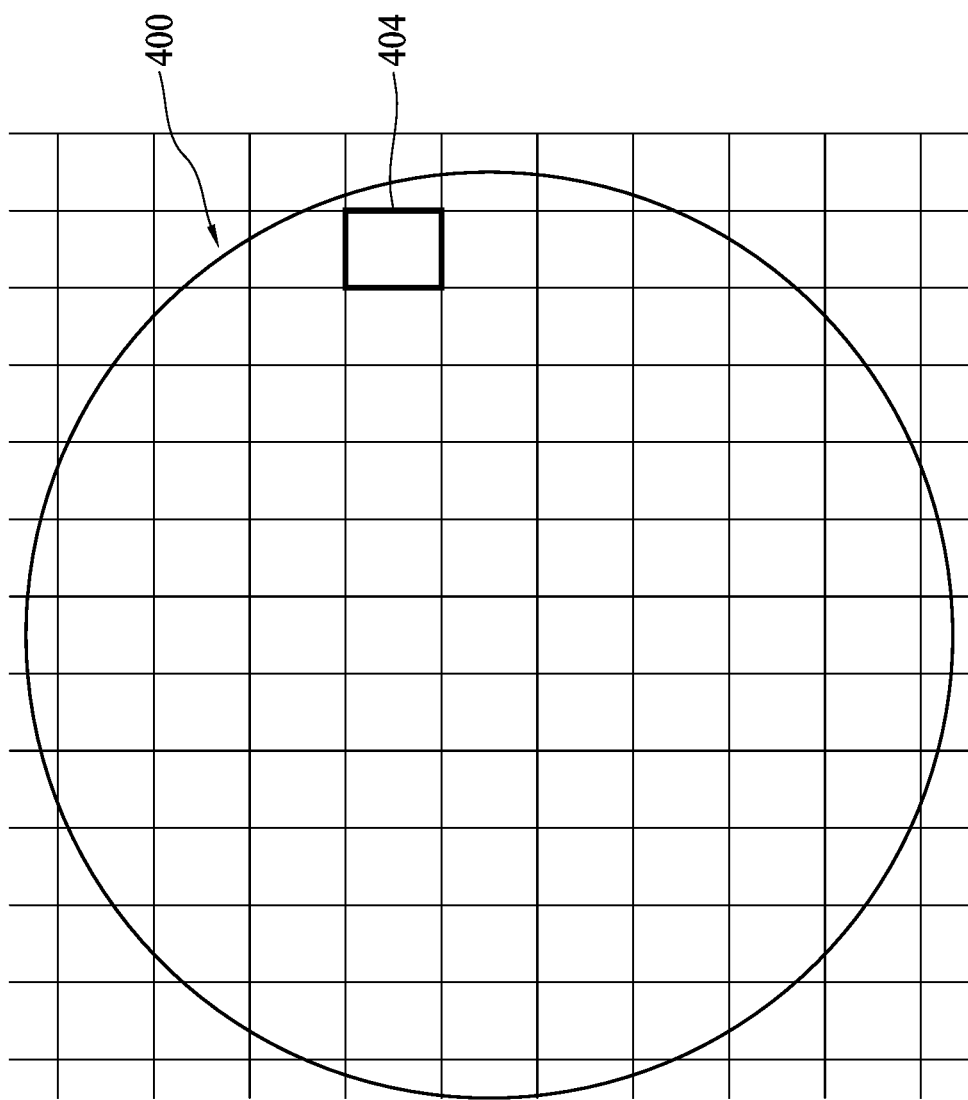
FIG. 5 is a top view of a wafer 400 in accordance with some embodiments.

FIG. 5 is a top view of the wafer 400 in accordance with some embodiments. In some embodiments, the wafer 400 includes a semiconductor wafer such as a silicon wafer. In some embodiments, the wafer 400 can include a layer (not shown) having a first pattern, and the first pattern includes various alignment marks (not shown) designed for alignment monitoring and overlay inspection. The layer can include a semiconductor material layer such as a silicon (Si) layer or a silicon germanium (SiGe) layer, a dielectric material layer such as an inter-layer dielectric (ILD) layer, or a conductive material layer such as a metal layer or a doped polysilicon layer in various embodiments, but the disclosure is not limited thereto.

In some embodiments, a material layer (not shown) can be formed on the patterned layer and a resist layer 402 (shown in FIG. 4) can be disposed over the material layer. The material layer can be patterned in subsequent operations to form a second pattern aligned with the first pattern. In some embodiments, the material layer can include a semiconductor material layer such as a Si layer or a SiGe layer, a dielectric material layer such as a silicon oxide (SiO) layer, a silicon nitride (SiN) or a low-k dielectric material layer, or a conductive material layer such as a metal layer or a doped polysilicon layer, but the disclosure is not limited thereto. In some embodiments, the resist layer 402 is coated on the material layer by suitable technology such as spin-on coating. The resist layer 402 is sensitive to the radiation beam during a lithography exposing process and is resistant to a subsequent process (such as etching or ion implantation). In some embodiments, the resist layer 402 includes a polymeric material as a matrix that is resistant; a radiation-sensitive component (such as photo-acid generator or PAG); and solvent. The resist layer 402 may be positive tone resist or negative tone resist. During the exposing process, a chemical difference between the illuminated and non-illuminated portions is created, and the difference may be exploited by subsequent chemical development. In some embodiments, the illuminated portions of the positive tone resist are removed during the development process. In alternative embodiments, the non-illuminated portions of the negative tone resist are removed during the development process. The wafer 400 may further undergo other operations, such as a thermal baking to reduce the solvent of the resist layer 402 after the spin-on coating.

Referring to FIGS. 4 and 5, a plurality of fields (also referred to as shot areas) 404 are defined over the wafer 400. The fields 404 can be referred to as an exposure region exposed by a photo mask, which includes patterns for one chip or several chips. As shown in FIG. 5, the fields 404 are arranged into columns and rows. In some embodiments, the resist layer 402 in one field 404 is exposed to the photo mask by the exposure apparatus 302, and the resist layer 402 in the next field 404 along the scan path P is then exposed to the photo mask by the exposure apparatus 302. In some embodiments, the resist layers 402 in other fields along another scan path P can then be exposed until the resist layers 402 in all of the fields 404 of the wafer 400 have been exposed. In some embodiments, the lithography exposure system 300 may scan the fields 404 with alignment marks before performing the exposure operation.

A surface topography is measured according to operation 122. Accordingly, a plurality of leveling data is obtained. In some embodiments, the plurality of leveling data is obtained by utilizing a leveling module (not shown). In some embodiments, the leveling module includes a leveling signal source and a leveling sensor. The leveling signal source includes, for example but not limited to, a laser source with a proper wavelength to effectively monitor local geometry of the wafer 400. The leveling sensor is sensitive to the leveling signal generated by the leveling signal sensor. In some embodiments, the leveling signal is generated by the leveling signal source, reflected from the wafer 400, and directed to and received by the leveling sensor. Consequently, a plurality of leveling data is obtained. In some embodiments, formation of the aforementioned material layer and the resist layer 402 and thermal baking are performed after operation 122.

Figure 6:
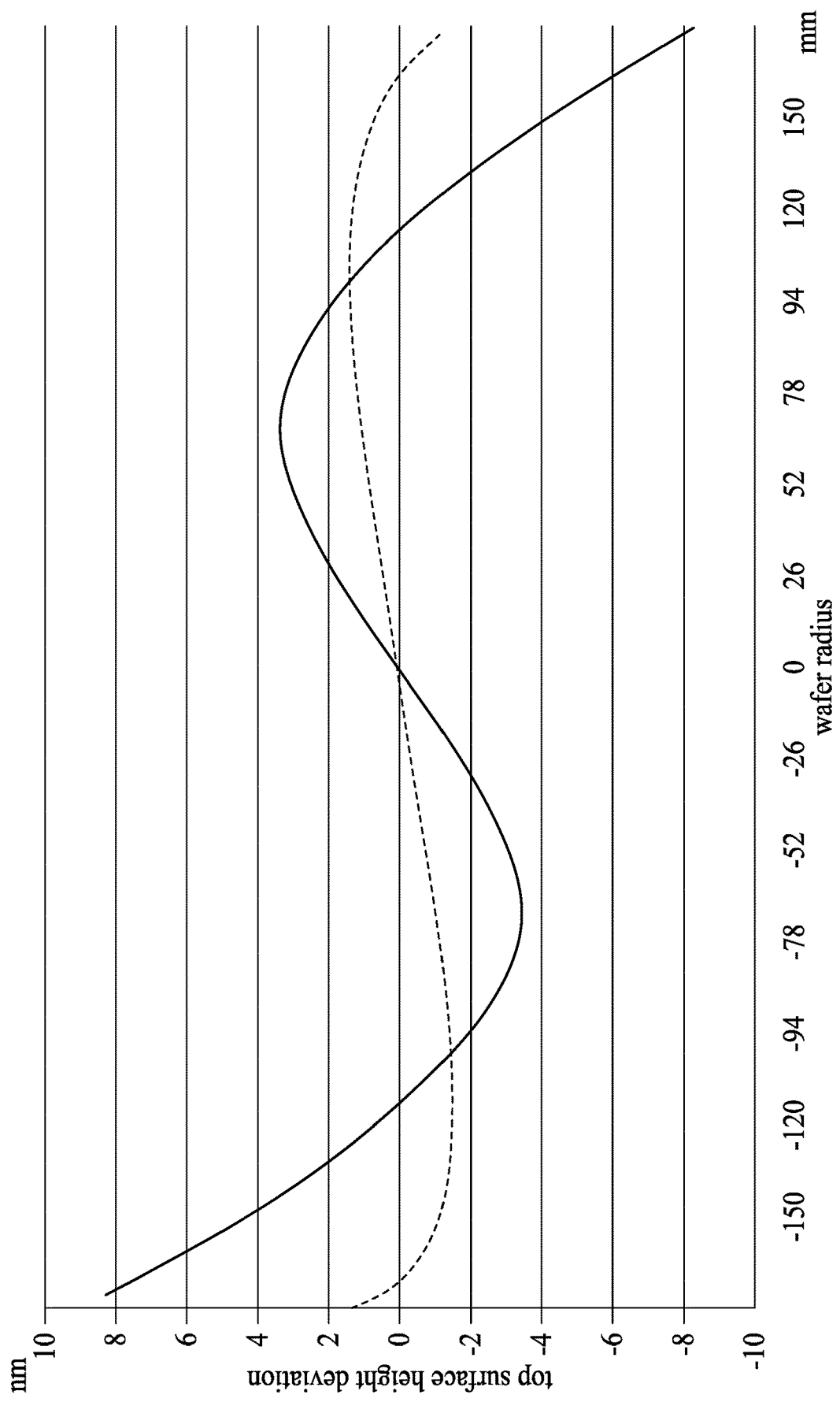
FIG. 6 is a graph showing topographical variation.

By way of example only, FIG. 6 is a graph showing topographical variation. As shown in FIG. 6, the x-axis is the wafer radius in millimeters and the y-axis is top surface height deviation in nanometers. According to operation 124, a topographical variation is obtained from the plurality of leveling data. In some embodiments, topographical variations between a center and a circumference of the wafer 400 can be reduced to values indicated by the dotted line shown in FIG. 6, which means the wafer 400 is substantially flat. In some embodiments, topographical variations between the center and the circumference of the wafer 400 can be significant, as shown by the solid line shown in FIG. 6, which means the wafer 400 may suffer from warpage and the alignment marks may suffer from distortion or shift.

Operation 126a or operation 126b is performed according to the topographical variation. In some embodiments, a single-zone alignment compensation is performed when the topographical variation is less than a predetermined value according to operation 126a. In some embodiments, a multi-zone alignment compensation is performed when the topographical variation is greater than the predetermined value according to operation 126b. In some embodiments, the predetermined value is equal to or less than 2 nm, but the disclosure is not limited to this.

Figure 7:
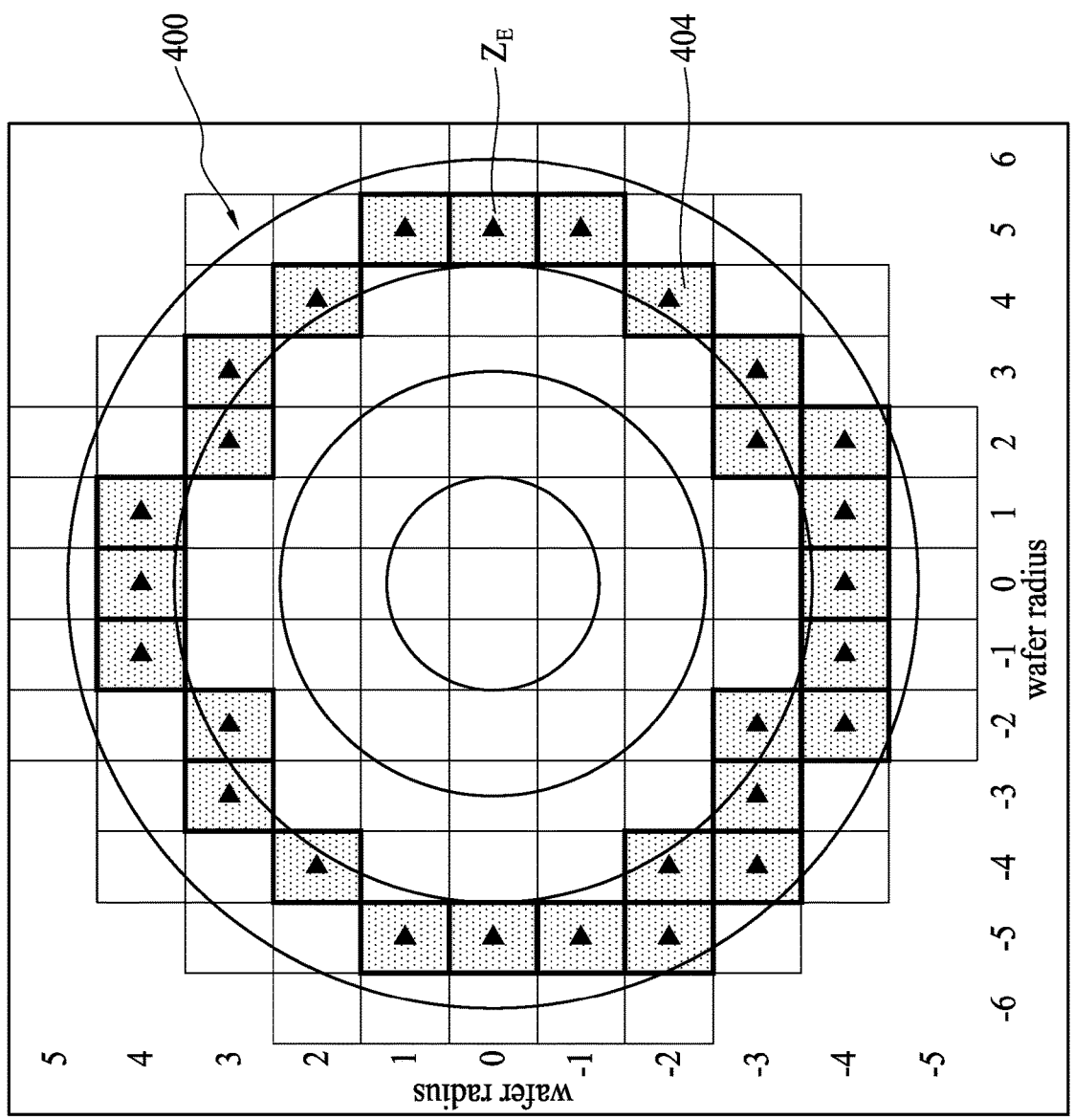
FIG. 7 is a top view of the wafer 400 in operation 126*a* in accordance with some embodiments.

FIG. 7 is a top view of the wafer 400 in operation 126a. In some embodiments, the single-zone alignment compensation further includes the following operations. For example, an edge zone $Z_E$ is defined over the wafer 400 as shown in FIG. 7. Further, the edge zone $Z_E$ includes a plurality of fields 404, which are marked with dots in FIG. 7. In some embodiments, the alignment apparatus 304 detects positions of a plurality of alignment marks (not shown) in each field 404 in the edge zone $Z_E$, and the controller 308 performs the single-zone alignment compensation on each field 404 in the edge zone $Z_E$ to obtain a plurality of real-time compensation values for wafer alignment. In some embodiments, the alignment apparatus 304 detects positions of an alignment mark (not shown) in each field 404 in the edge zone $Z_E$, and the controller 308 performs the single-zone alignment compensation on each field 404 in the edge zone $Z_E$. In some embodiments, some of the fields 404 in the edge zone $Z_E$ have one or more alignment marks (not shown) while other fields 404 in the edge zone $Z_E$ have no alignment marks. In some embodiments, the locations of the alignment marks are chosen to coincide with a boundary of the fields 404. In some embodiments, each field includes one chip or alternatively multiple chips, and thus the alignment marks are disposed over regions where scribe lines are to be formed. Because the chips are separated by dicing through the scribe lines at a later fabrication stage, the alignments will not occupy the valuable space used to form an integrated circuit (IC) device.

It should be noted that the single-zone alignment compensation is performed for both the x direction and the y direction. In some embodiments, the alignment apparatus 304 detects positions of the alignment marks in each field 404 in the edge zone $Z_E$ along the x direction, and then detects positions of the alignment marks in each field 404 in the edge zone $Z_E$ along the y direction. Next, the controller 308 performs the single-zone alignment compensation respectively for the x direction and the y direction. Consequently, the plurality of compensation values for wafer alignment includes values for both the x direction and the y direction. In some embodiments, the single-zone alignment compensation includes a linear module, but the disclosure is not limited thereto.

Referring to FIG. 2, operation 128 is performed. For example, the wafer stage 306 is provided with a wafer-moving mechanism (such as a stepping motor or lead screw) that moves the wafer 400 in the x direction and the y direction according to the plurality of compensation values for wafer alignment provided by the controller 308. For example, the exposure apparatus 302 is moved along the scan path P and aligns a photo mask with each field 404 according to the plurality of compensation values. As mentioned above, the resist layer 402 in each field 404 is then exposed to the photo mask by the exposure apparatus 302. In some embodiments, the wafer stage 306 rotates the wafer 400 within the surface plane of the wafer 400 according to the plurality of compensation values for wafer alignment provided by the controller 308. In other words, the wafer stage 306 is capable of moving in translational and rotational modes such that the wader 400 may be aligned with the photomask.

In summary, according to the method 12, when a topographical variation of the wafer 400 is less than the predetermined value (e.g., 2 nm), the edge zone $Z_E$ is defined, alignment marks in the fields 404 in the edge zone $Z_E$ are detected, and the single-zone alignment compensation is performed to obtain the plurality of compensation values. Notably, the wafer alignment for each field 404 of the whole wafer 400 is performed according to the plurality of compensation values obtained from the single-zone alignment compensation, which is based on the edge zone $Z_E$.

In some embodiments, after the lithography exposure, the resist layer 402 is developed such that patterns are transferred from the photo mask to the resist layer 402, and then transferred to the material layer by layer etching. Such operations can be referred to as lithography patterning. Accordingly, patterns and alignment marks can be formed in the patterned material layer, and overlay accuracy between the patterned material layer and its underlying patterned material layer can be measured by an overlay tool. In some embodiments, the overlay tool measures the deviation between the alignment marks in the two layers, and such measurement data can be stored in a database. In some embodiments, such measurement data can be used in the single-zone alignment compensation for the lithography operation for the next layer.

Figure 8A:
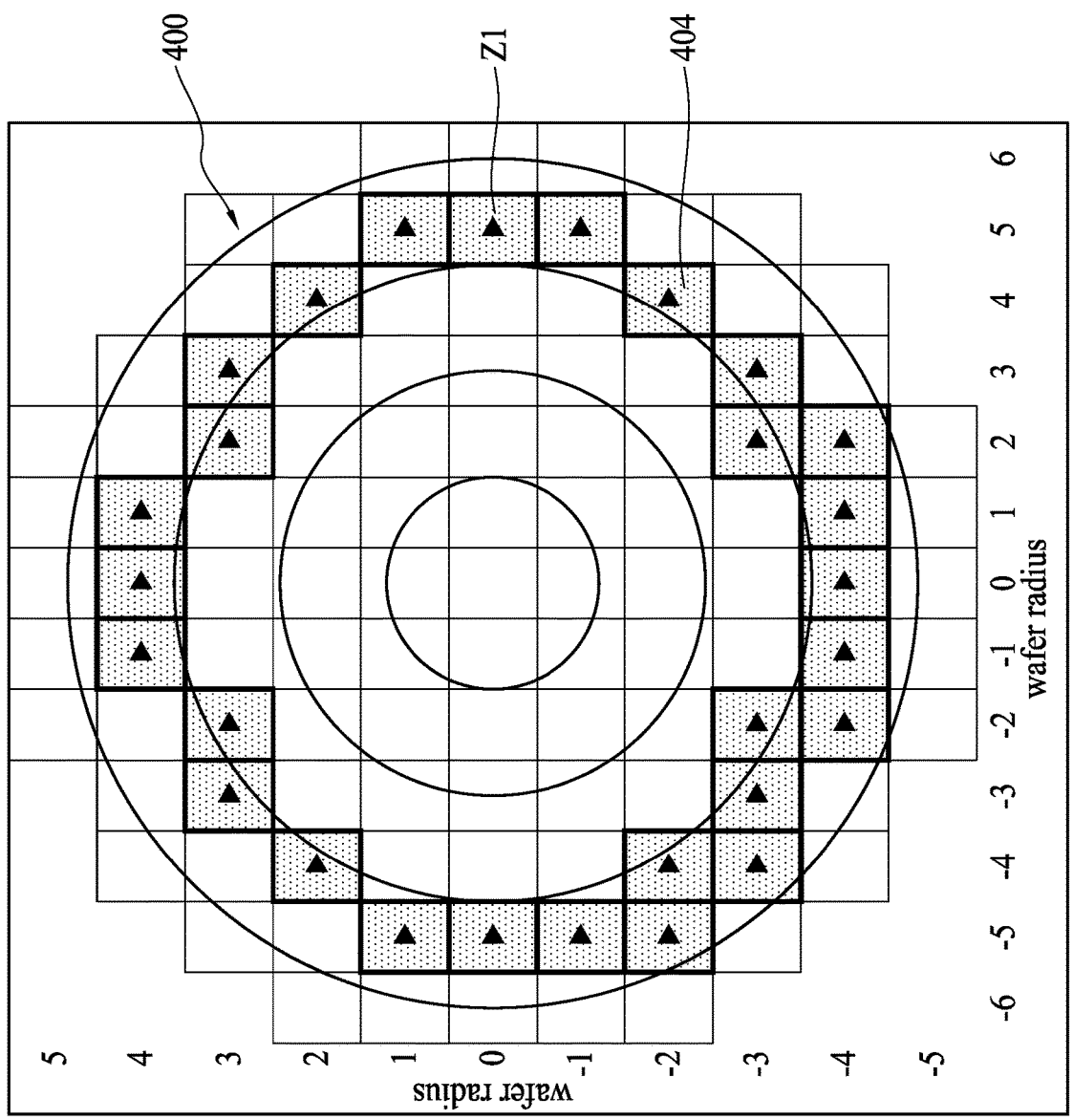
FIGS. 8A to 8C are top views of the wafer 400 at various fabrication stages in operation 126*b* in accordance with some embodiments.
Figure 8B:
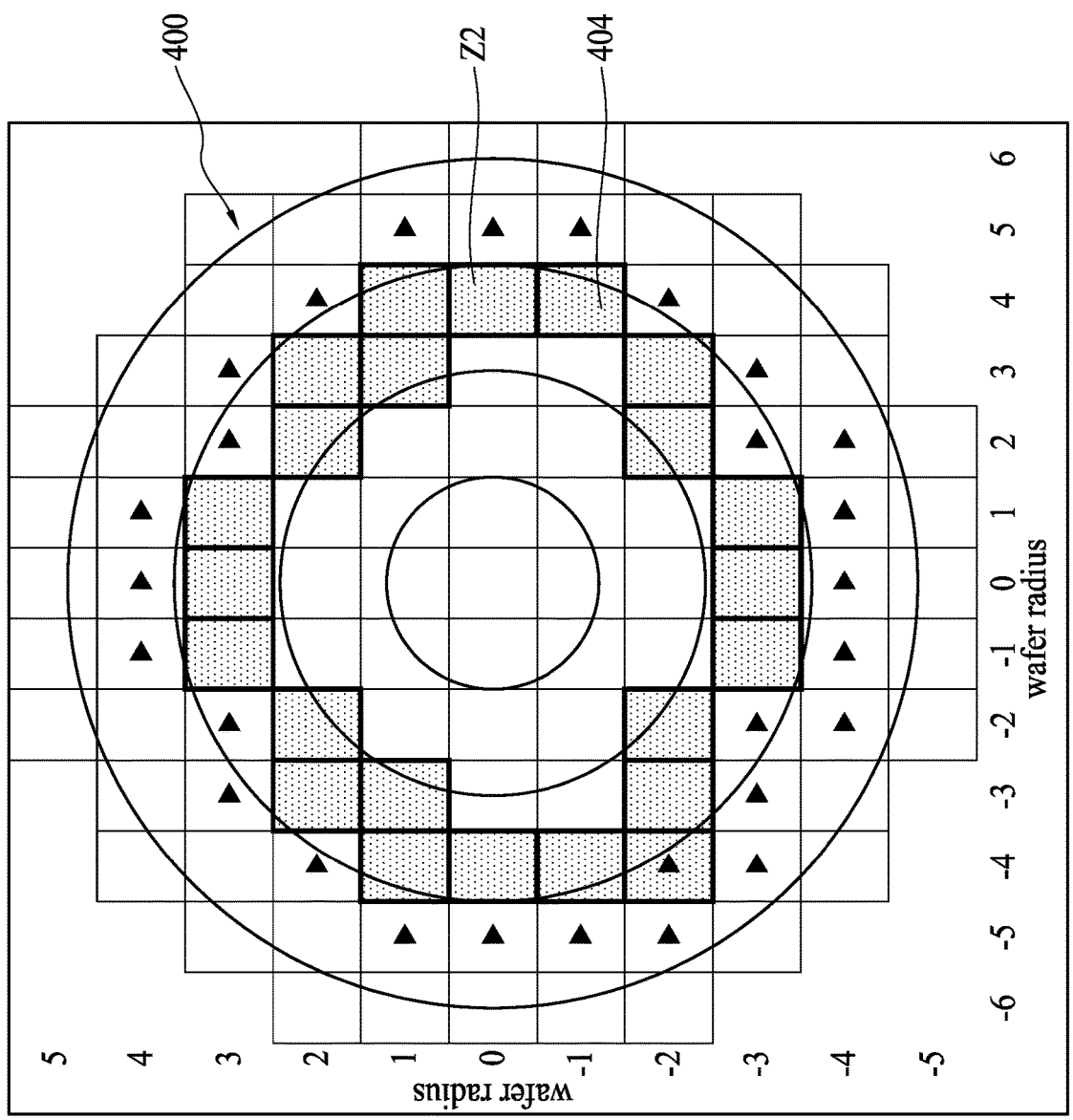
Figure 8C:
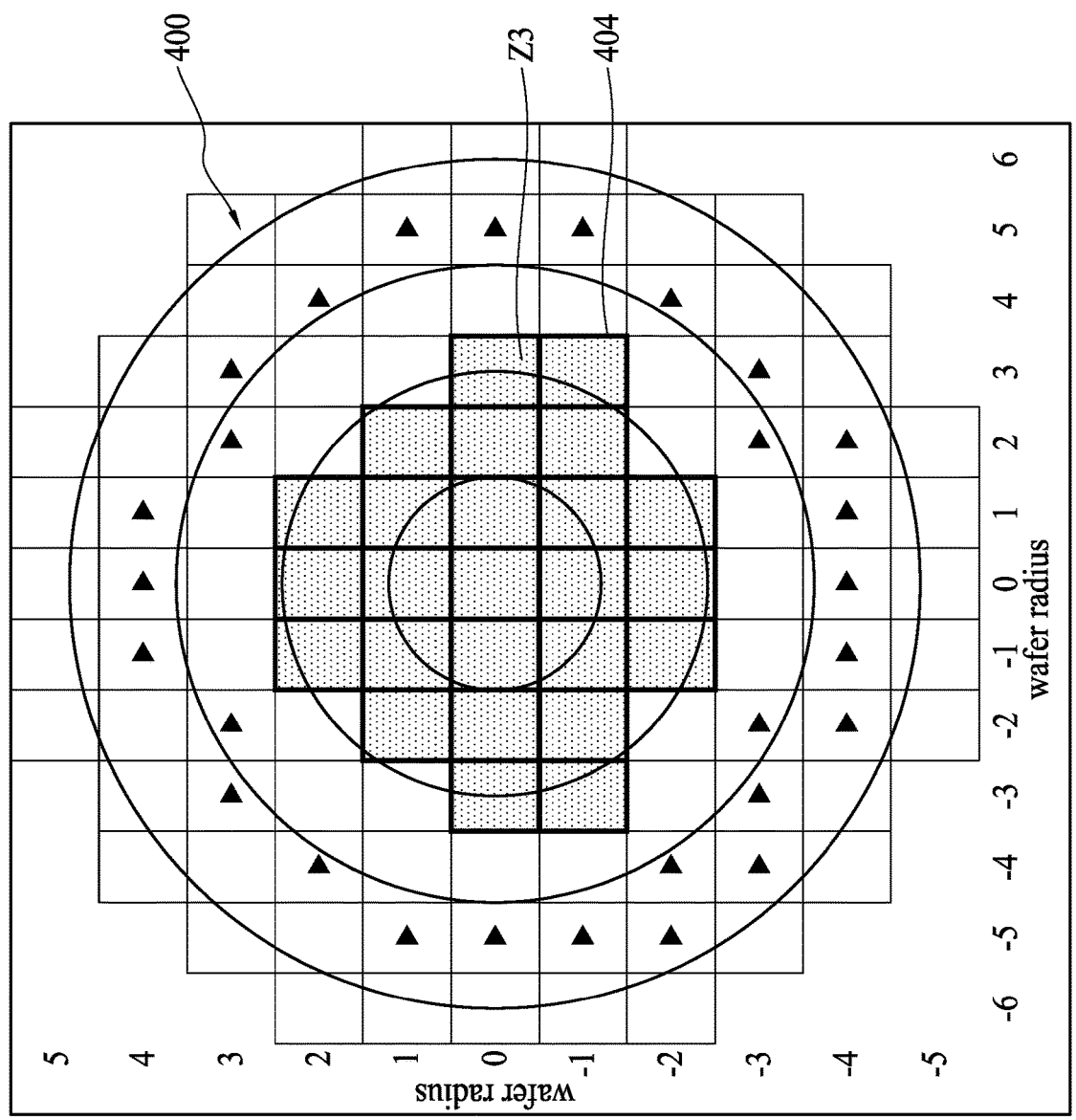

In some embodiments, a multi-zone alignment compensation is performed when the topographical variation is greater than the predetermined value according to operation 126b. In some embodiments, the predetermined value is equal to or less than 2 nm, but the disclosure is not limited thereto. FIGS. 8A to 8C are top views of the wafer 400 at various fabrication stages in operation 126b. In some embodiments, the multi-zone alignment compensation further includes the following operations. For example, a plurality of zones is defined over the wafer 400 according to operation 102. In some embodiments, the plurality of zones includes a first zone Z1 to an $N^{th}$ zone Zn, wherein n is a positive integer greater than 1. In some embodiments, n is less than 1000, but the disclosure is not limited thereto. Therefore, it can be understood that a first zone Z1 to an $N^{th}$ zone Zn are defined over the wafer 400 according to operation 202. Each of the zones (i.e., the first zone Z1 to the $N^{th}$ zone Zn) includes a plurality of fields 404, which are marked with dots in FIGS. 8A to 8C. As shown in FIGS. 8A to 8C, the zones can be arranged in concentric circles, but the disclosure is not limited thereto. The first zone Z1 is an edge zone while the $N^{th}$ zone Zn is a center zone. For example, when n is 3, the first zone Z1 is the edge zone while the third zone Z3 is the center zone, as shown in FIGS. 8A to 8C.

In some embodiments, the multi-zone alignment compensation is then performed for each zone according to an equation to obtain a plurality of compensation values for each of the plurality of zones, according to operation 104. In some embodiments, the multi-zone alignment compensation is performed for the first zone Z1 to the $N^{th}$ zone Zn to obtain a first compensation value for the first zone Z1 to an $N^{th}$ compensation value for the $N^{th}$ zone Zn according to operation 204. Notably, the multi-zone alignment compensation is performed according to an equation as follows:

$$dXm = \alpha_m*Z1 + \beta_m*Z2 + \gamma_m*Z3 + \ldots \omega_m*Zn \quad (1)$$

In the equation (1), m indicates that the zone undergoes the multi-zone alignment compensation and m is a positive integer less than or equal to n, dXm indicates the compensation value to be adjusted during the wafer alignment, $\alpha_m$ indicates a weighting for the fields in the first zone during performing of the multi-zone alignment compensation for an $m^{th}$ zone, $\beta_m$ indicates a weighting for the fields in a second zone during performing of the multi-zone alignment compensation for the $m^{th}$ zone, $\gamma_m$ indicates a weighting for the fields in a third zone during performing of the multi-zone alignment compensation for the $m^{th}$ zone, $\omega_m$ indicates a weighting for the fields in the $N^{th}$ zone during performing of the multi-zone alignment compensation for the $m^{th}$ zone. In some embodiments, m is equal to or smaller than n. In some embodiments, m is equal to or greater than 1.

For example, when n is equal to 3, the fields 404 over the whole wafer 400 are divided into the first zone Z1 as shown in FIG. 8A, the second zone Z2 as shown in FIG. 8B, and the third zone Z3 as shown in FIG. 8C. Therefore, the equation can be presented as:

$$dXm = \alpha m*Z1 + \beta m*Z2 + \gamma m*Z3 \quad (2)$$

The multi-zone alignment compensation is then performed for the first zone Z1, and thus m is equal to 1. In some embodiments, the alignment apparatus 304 detects positions of the alignment marks in each field 404 in the first zone Z1 as shown in FIG. 8A, and the controller 308 performs the multi-zone alignment compensation for each field 404 in the first zone Z1 to obtain real-time first compensation values for wafer alignment according to the equation:

$$dX1 = \alpha1*Z1 + \beta1*Z2 + \gamma1*Z3 \quad (3)$$

It should be noted that when a weighting includes m being equal to n, such weighting value is greater than other weighting values. For example, when performing the multi-zone alignment compensation for the first zone Z1 (m=1), the weighting value $\alpha1$ for the first zone Z1 (n=1) is greater than other weighting values (i.e., $\beta1$ and $\gamma1$) for the second zone Z2 and the third zone Z3.

The multi-zone alignment compensation is then performed for the second zone Z2, and thus m is equal to 2. In some embodiments, the alignment apparatus 304 detects positions of the alignment marks in each field 404 in the second zone Z2 as shown in FIG. 8B, and the controller 308 performs the multi-zone alignment compensation for each field 404 in the second zone Z2 to obtain real-time second compensation values for wafer alignment according to the equation:

$$dX2 = \alpha2*Z1 + \beta2*Z2 + \gamma2*Z3 \quad (4)$$

As mentioned above, when a weighting includes m being equal to n, such weighting value is greater than other weighting values. Therefore, when performing the multi-zone alignment compensation for the second zone Z2 (m=2), the weighting value $\beta2$ for the second zone Z2 (n=2) is greater than other weighting values (i.e., $\alpha2$ and $\gamma2$) for the first zone Z1 and the third zone Z3.

The multi-zone alignment compensation is then performed for the third zone Z3, and thus m is equal to 3. In some embodiments, the alignment apparatus 304 detects positions of the alignment marks in each field 404 in the third zone Z3 as shown in FIG. 8C, and the controller 308 performs the multi-zone alignment compensation for each field 404 in the third zone Z3 to obtain real-time third compensation values for wafer alignment according to the equation:

$$dX3 = \alpha3*Z1 + \beta3*Z2 + \gamma3*Z3 \quad (5)$$

As mentioned above, when a weighting includes m being equal to n, such weighting value is greater than other weighting values. Therefore, when performing the multi-zone alignment compensation for the third zone Z3 (m=3), the weighting value $\gamma3$ for the third zone Z3 (n=3) is greater than other weighting values (i.e., $\alpha3$ and $\beta3$) for the first zone Z1 and the second zone Z2.

Further, it should be noted that the multi-zone alignment compensation is performed for both the x direction and the y direction in the first zone Z1, the second zone Z2 and the third zone Z3. In some embodiments, the alignment apparatus 304 detects positions of the alignment marks in each field 404 in the first zone Z1 along the x direction, and then detects positions of the alignment marks in each field 404 in the first zone Z along the y direction. Next, the controller 308 performs the multi-zone alignment compensation respectively for the x direction and the y direction. Consequently, the first compensation values for the first zone Z1 include values for both the x direction and the y direction. Similarly, the aforementioned operations are performed for the second zone Z2 and the third zone Z3, respectively. In some embodiments, the multi-zone compensation can be performed after finishing detection of alignment marks in the fields in all zones along the x direction and the y direction.

In some embodiments, wafer alignment is performed for each of the plurality of zones according to the plurality of compensation values in accordance with operation 106. In some embodiments, a first wafer alignment is performed for the first zone Z1 according to the first compensation values, followed by a first lithography exposure performed on the resist layer 402 over the first zone Z1, according to operation 206. In some embodiments, for example, the wafer stage 306 is provided with a wafer-moving mechanism that moves and rotates the wafer 400 in the x direction and the y direction according to the plurality of compensation values for wafer alignment conveyed from the controller 308. The exposure apparatus 302 is then moved along a scan path P and aligns a photo mask with each field 404 in the first zone Z1 according to the first compensation values. As mentioned above, the resist layer 402 in each field 404 in the first zone Z1 is then exposed to the photo mask by the exposure apparatus 302.

A second wafer alignment is performed for the second zone Z2 according to the second compensation values, followed by a second lithography exposure performed on the resist layer 402 over the second zone Z2, according to operation 208. As mentioned above, the wafer stage 306 is provided with a wafer-moving mechanism that moves and rotates the wafer 400 in the x direction and the y direction according to the second compensation values for the second wafer alignment provided by the controller 308. The exposure apparatus 302 is then moved along a scan path P and aligns a photo mask with each field 404 in the second zone Z2 according to the second compensation values. As mentioned above, the resist layer 402 in each field 404 in the second zone Z2 is then exposed to the photo mask by the exposure apparatus 302.

A third wafer alignment is performed for the third zone Z3 according to the third compensation values, followed by a third lithography exposure performed on the resist layer 402 over the third zone Z3, according to operation 208. As mentioned above, the wafer stage 306 moves and rotates the wafer 400 in the x direction and the y direction according to the third compensation values for the third wafer alignment provided by the controller 308. The exposures apparatus 302 is then moved along a scan path P and aligns a photo mask with each field 404 in the third zone Z3 according to the third compensation values. As mentioned above, the resist layer 402 in each field 404 in the third zone Z3 is then exposed to the photo mask by the exposure apparatus 302.

It should be noted that the wafer alignment and the lithography exposure are performed zone-by-zone until an $N^{th}$ wafer alignment is performed for the $N^{th}$ zone Zn according to the $N^{th}$ compensation values, and an $N^{th}$ lithography exposure is performed on the resist layer 402 over the $N^{th}$ zone Zn, according to operation 208.

In some embodiments, when a topographical variation of the wafer 400 is less than the predetermined value (e.g., 2 nm), the edge zone $Z_E$ is defined, alignment marks in the fields 404 in the edge zone $Z_E$ are detected, and the single-zone alignment compensation is performed to obtain the plurality of compensation values. Notably, the wafer alignment for each field 404 of the whole wafer 400 is performed according to the plurality of compensation values obtained from the single-zone alignment compensation, which is based on the edge zone $Z_E$. Further, lithography exposure for each field 404 can be performed after the wafer alignment.

In some embodiments, when a topographical variation of the wafer 400 is greater than the predetermined value, the plurality of zones (i.e., Z1 to Zn) is defined, alignment marks in the fields 404 in each zone are detected, and the multi-zone alignment compensation is performed to obtain the first to $N^{th}$ compensation values. Notably, the wafer alignment and the lithography exposure for the fields 404 in different zones are performed zone-by-zone. For example, a first wafer alignment and a first exposure for the fields 404 in the first zone Z1 are performed, a second wafer alignment and second exposure for the fields 404 in the second zone Z2 are subsequently performed, and so on, until the $N^{th}$ wafer alignment and $N^{th}$ exposure for the fields 404 in the $N^{th}$ zone Zn are performed. In other words, a sequence including the wafer alignment and the lithography exposure are performed zone-by-zone.

It should be noted that when the topographical variation of the wafer 400 is greater than the predetermined value, the topography of the wafer 400 may render different influences on different zones of the wafer 400. Therefore the first zone Z1 to the third zone Z3 are defined and the wafer alignments are performed zone-by-zone according to the first compensation values to the third compensation values. Accordingly, influences on different zones are compensated, and thus overlay accuracy is ensured.

In some embodiments, after the lithography exposure, the resist layer 402 is developed such that patterns are transferred from the photo mask to the resist layer 402, and then transferred to the material layer by layer etching. Such operations can be referred to as lithography patterning. Accordingly, patterns and alignment marks can be formed in the patterned material layer, and overlay accuracy between the patterned material layer and its underlying patterned material layer can be measured by an overlay tool. In some embodiments, the overlay tool measures the deviation between the alignment marks in the two layers, and such measurement data can be stored in a database. Further, a mean+3 sigma value for the alignment residual can be obtained by the measurement data. In some embodiments, when the alignment residual is less than, for example but not limited to, 4 nm, the wafer 400 can be transferred to a next operation. In some embodiments, such measurement data can be used in the multi-zone alignment compensation for the lithography operation for the next layer.

In some embodiments, a multi-zone alignment compensation is performed when the topographical variation is greater than the predetermined value according to operation 126b. In some embodiments, the predetermined value is equal to or less than 2 nm, but the disclosure is not limited to this. FIGS. 9A to 9E are top views of the wafer 400 at various fabrication stages in operation 126b. In some embodiments, the multi-zone alignment compensation further includes the following operations. For example, a plurality of zones is defined over the wafer 400 according to operation 102. In some embodiments, the plurality of zones includes a first zone Z1 to an $N^{th}$ zone Zn, wherein n is a positive integer greater than 1. As mentioned above, n is less than 1000, but the disclosure is not limited thereto. Therefore, it can be understood that a first zone Z1 to an $N^{th}$ zone Zn are defined over the wafer 400 according to operation 202. Each of the zones includes a plurality of fields 404, which are marked with dots in FIGS. 9A to 9E. As shown in FIGS. 9A to 9E, the zones are arranged in concentric circles, but the disclosure is not limited thereto. For example, the zones may be polygon blocks of an integer number of fields 404. In some cases, the zones may include non-contiguous fields. In some embodiments, the number of the zones is determined based on the difference between the topographical variation and the predetermined value. For example, the greater the difference, the more zones are defined. In certain embodiments, the fields 404 in each zone are selected based on the topographical variation. For example, fields having similar topographical variations that are close together or having a similar distance to the center of the wafer are selected into one zone. The first zone Z1 is an edge zone while the $N^{th}$ zone Zn is a center zone. In some embodiments, when n is 5, the first zone Z1 is the edge zone while the fifth zone Z5 is the center zone, as shown in FIGS. 9A to 9E.

In some embodiments, the multi-zone alignment compensation is performed for each of the plurality of zones according to an equation, in order to obtain a plurality of compensation data for each of the plurality of zones, according to operation 104. In some embodiments, the multi-zone alignment compensation for the first zone Z1 to the $N^{th}$ zone Zn is performed to obtain a first compensation value for the first zone Z to an N compensation value for the $N^{th}$ zone Zn according to operation 204. The multi-zone alignment compensation is performed according to the aforementioned equation (1).

Figure 9A:
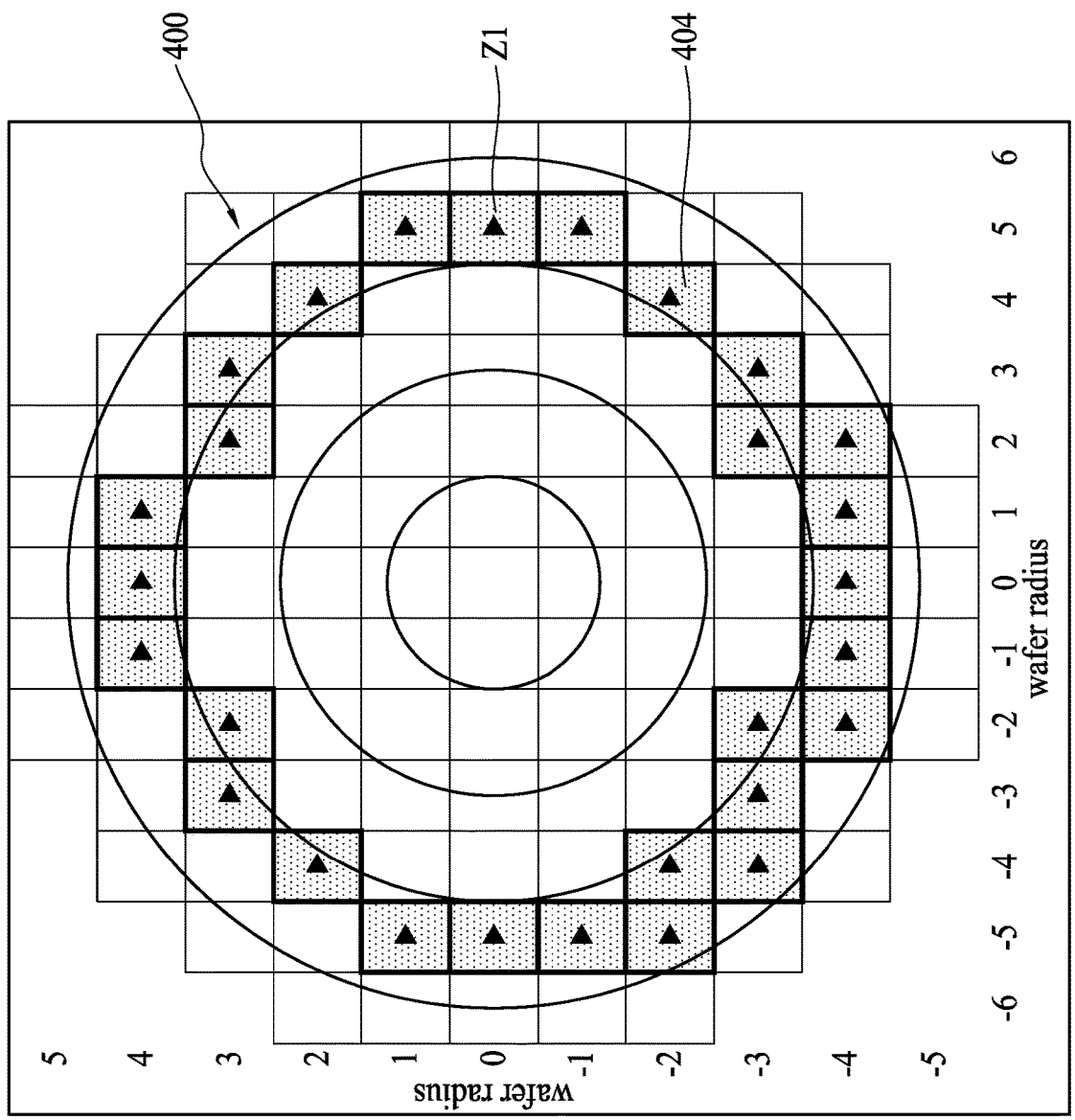
FIGS. 9A to 9E are top views of the wafer 400 at various fabrication stages in operation 126*b* in accordance with some embodiments.
Figure 9B:
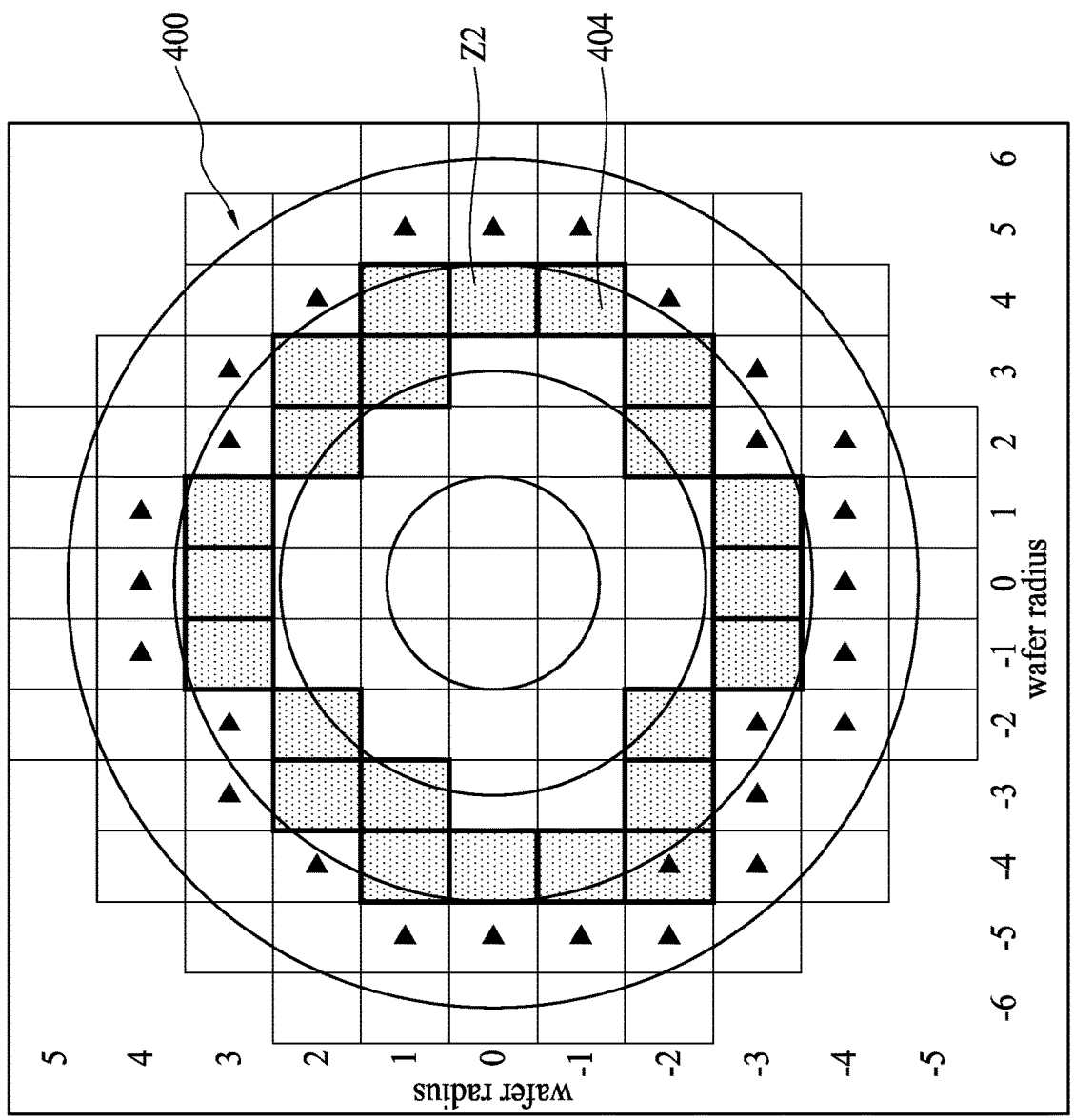
Figure 9C:
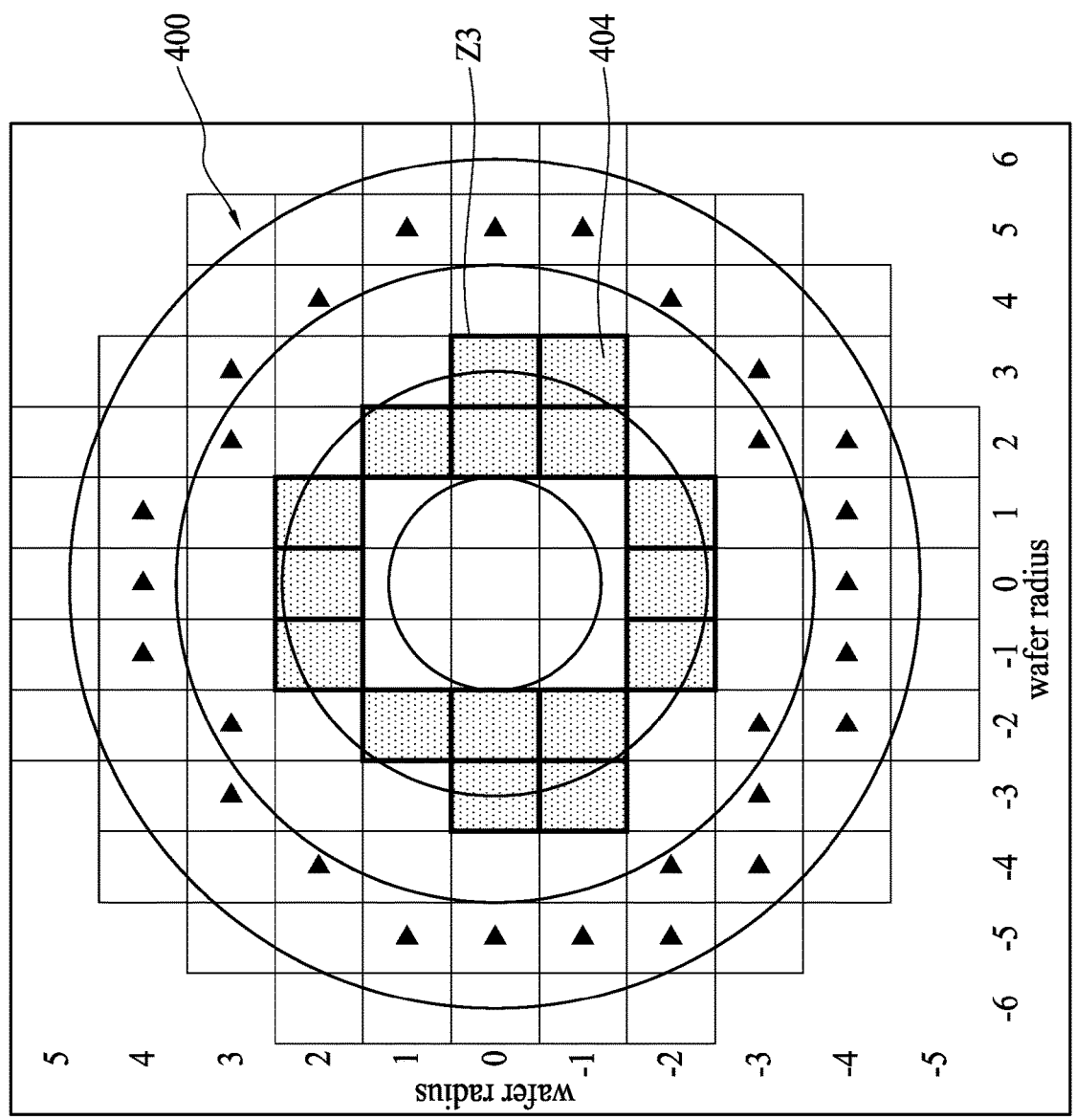
Figure 9D:
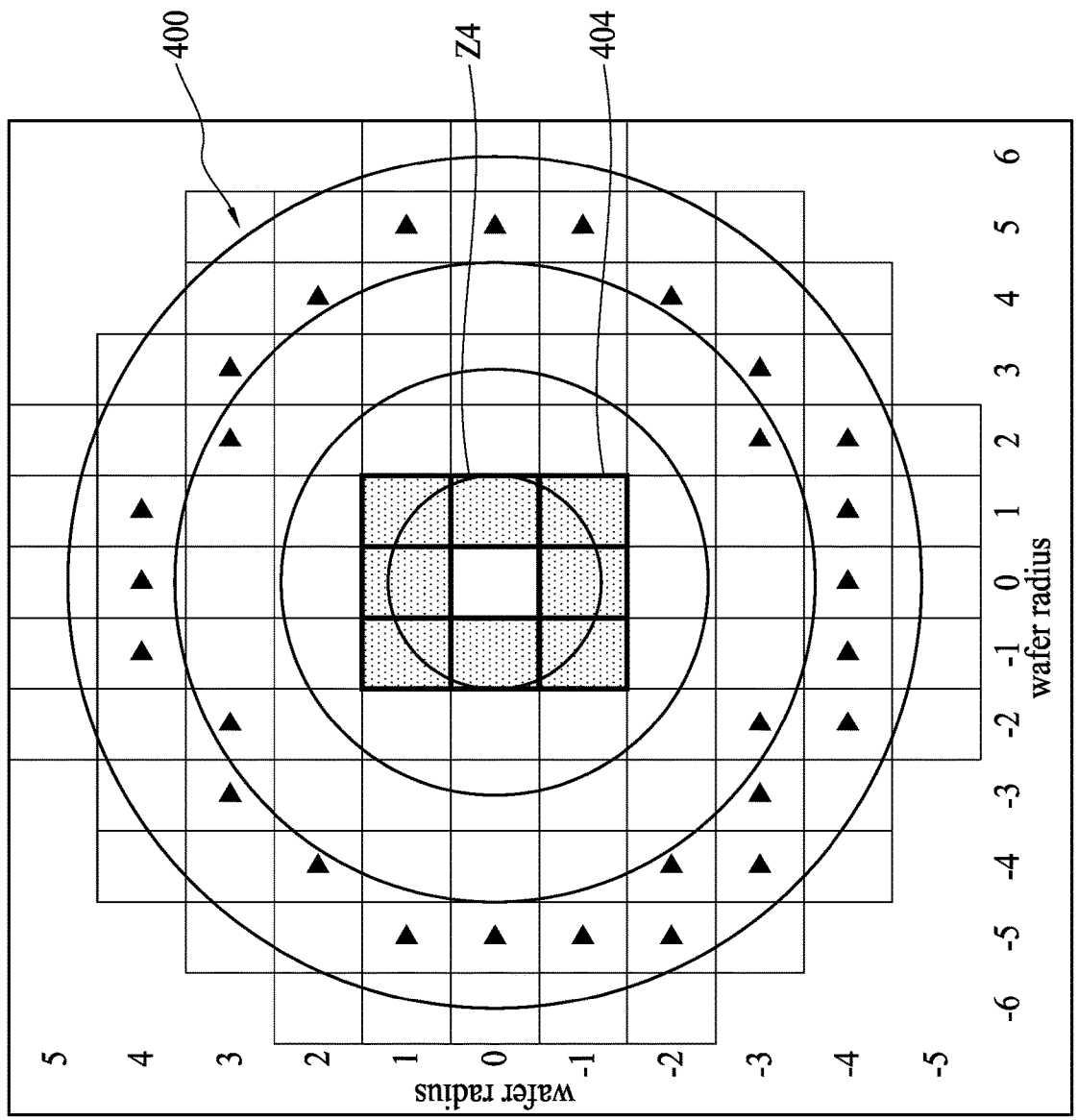
Figure 9E:
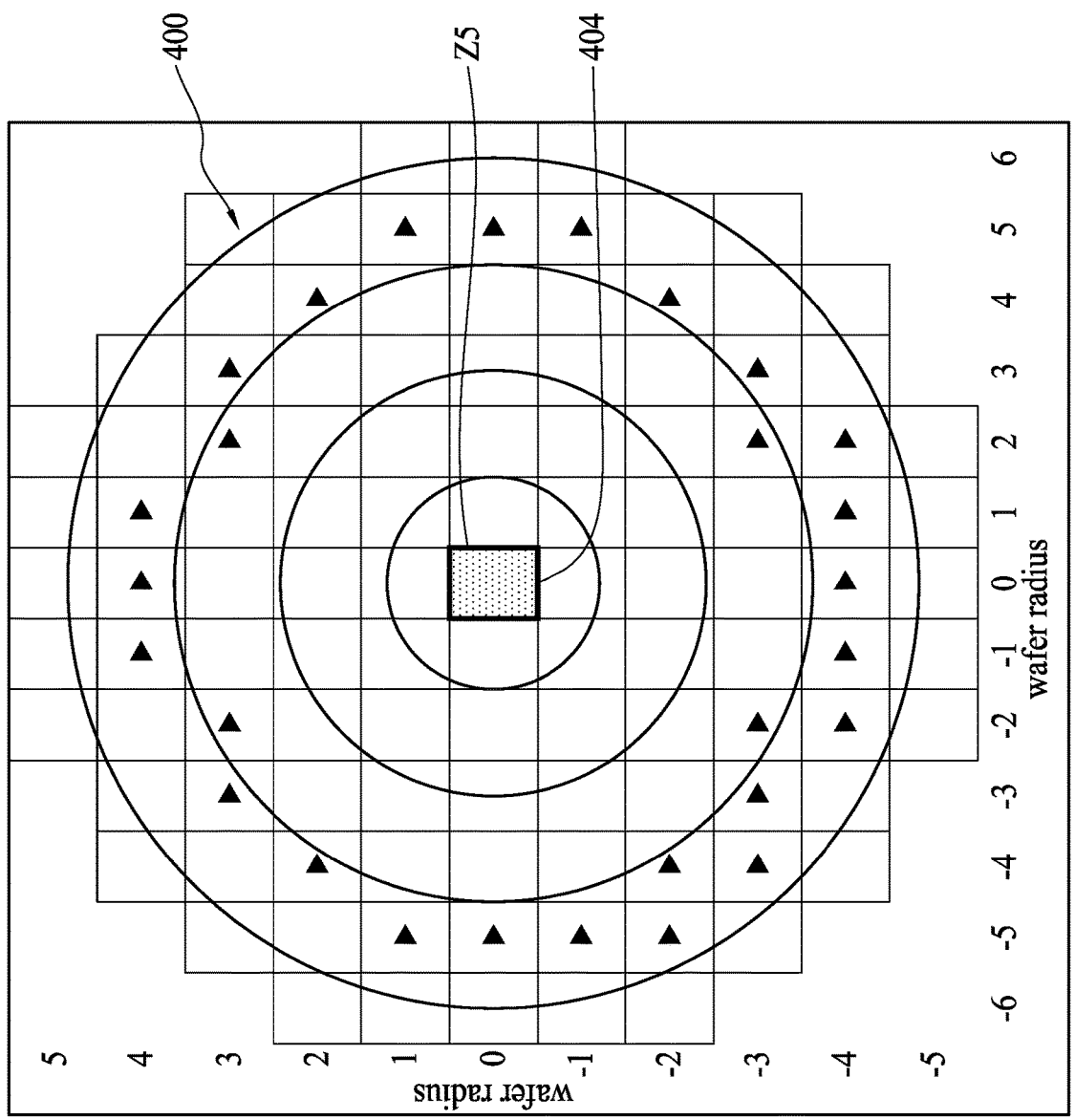

For example, when n is equal to 5, the fields 404 over the whole wafer 400 are divided into the first zone Z1 as shown in FIG. 9A, the second zone Z2 as shown in FIG. 9B, the third zone Z3 as shown in FIG. 9C, the fourth zone Z4 as shown in FIG. 9D, and the fifth zone Z5 as shown in FIG. 9E. Therefore, the equation (1) can be presented as:

$$dXm=\alpha m*Z1+\beta m*Z2+\gamma m*Z3+\delta m*Z4+\varepsilon m*Z5 \quad (6)$$

The multi-zone alignment compensation is then performed for the first zone Z1, and thus m is equal to 1. In some embodiments, the alignment apparatus 304 detects positions of the alignment marks in each field 404 in the first zone Z1 as shown in FIG. 9A, and the controller 308 performs the multi-zone alignment compensation for each field 404 in the first zone Z1 to obtain real-time first compensation values for wafer alignment according to the equation:

$$dX1=\alpha 1*Z1+\beta 1*Z2+\gamma 1*Z3+\delta 1*Z4+\varepsilon 1*Z5 \quad (7)$$

As mentioned above, when a weighting includes m being equal to n, such weighting value is greater than other weightings. Accordingly, when performing the multi-zone alignment compensation for the first zone Z1 (m=1), the weighting value $\alpha 1$ for the first zone Z1 (n=1) is greater than other weighting values (i.e., $\beta 1$, $\gamma 1$, $\delta 1$ and $\varepsilon 1$). The multi-zone alignment compensation is then performed for the second zone Z2, and thus m is equal to 2. The multi-zone alignment compensation is performed for each field 404 in the second zone Z2 to obtain real-time second compensation values for wafer alignment according to the equation:

$$dX2=\alpha 2*Z1+\beta 2*Z2+\gamma 2*Z3+\delta 2*Z4+\varepsilon 2*Z5 \quad (8)$$

As mentioned above, when performing the multi-zone alignment compensation for the second zone Z2 (m=2), the weighting value $\beta 2$ for the second zone Z2 (n=2) is greater than other weighting values (i.e., $\alpha 2$, $\gamma 2$, $\delta 2$ and $\varepsilon 2$). The multi-zone alignment compensation is then performed for the third zone Z3, and thus m is equal to 3. The multi-zone alignment compensation is performed for each field 404 in the third zone Z3 to obtain real-time third compensation values for wafer alignment according to the equation:

$$dX3=\alpha 3*Z1+\beta 3*Z2+\gamma 3*Z3+\delta 3*Z4+\varepsilon 3*Z5 \quad (9)$$

As mentioned above, when performing the multi-zone alignment compensation for the third zone Z3 (m=3), the weighting value $\gamma 3$ for the third zone Z3 (n=3) is greater than other weighting values (i.e., $\alpha 3$, $\beta 3$, $\delta 3$ and $\varepsilon 3$). The multi-zone alignment compensation is then performed for the fourth zone Z4, and thus m is equal to 4. The multi-zone alignment compensation is performed for each field 404 in the fourth zone Z4 to obtain real-time fourth compensation values for wafer alignment according to the equation:

$$dX4=\alpha 4*Z1+\beta 4*Z2+\gamma 4*Z3+\delta 4*Z4+\varepsilon 4*Z5 \quad (10)$$

As mentioned above, when performing the multi-zone alignment compensation for the fourth zone Z4 (m=4), the weighting value $\delta 4$ for the fourth zone Z4 (n=4) is greater than other weighting values (i.e., $\alpha 4$, $\beta 4$, $\gamma 4$ and $\varepsilon 4$). The multi-zone alignment compensation is then performed for the fifth zone Z5, and thus m is equal to 5. The multi-zone alignment compensation is performed for each field 404 in the fifth zone Z5 to obtain real-time fifth compensation values for wafer alignment according to the equation:

$$dX5=\alpha 5*Z1+\beta 5*Z2+\gamma 5*Z3+\delta 5*Z4+\varepsilon 5*Z5 \quad (11)$$

As mentioned above, when performing the multi-zone alignment compensation for the fifth zone Z5 (m=5), the weighting value $\varepsilon 5$ for the fifth zone Z5 (n=5) is greater than other weighting values (i.e., $\alpha 5$, $\beta 5$, $\gamma 5$ and $\delta 5$).

It should be noted that the multi-zone alignment compensation is performed for both the x direction and the y direction in each of the first zone Z1 to the fifth zone Z5.

In some embodiments, wafer alignment is performed for each zone according to the plurality of compensation values according to operation 106. In some embodiments, a first wafer alignment is performed for the first zone Z according to the first compensation values, followed by a first lithography exposure performed on the resist layer 402 over the first zone Z1, according to operation 206. In some embodiments, for example, the wafer stage 306 is provided with a wafer-moving mechanism that moves and rotates the wafer 400 in the x direction and the y direction according to the first compensation values for wafer alignment provided by the controller 308. The exposure apparatus 302 is then moved along a scan path P and aligns a photo mask with each field 404 in the first zone Z according to the first compensation values. As mentioned above, the resist layer 402 in each field 404 in the first zone Z1 is then exposed to the photo mask by the exposure apparatus 302.

A second wafer alignment is performed for the second zone Z2 according to the second compensation values, followed by a second lithography exposure performed on the resist layer 402 over the second zone Z2, according to operation 208. A third wafer alignment is performed for the third zone Z3 according to the third compensation values, followed by a third lithography exposure performed on the resist layer 402 over the third zone Z3, according to operation 208. In some embodiments, operation 208 is repeatedly performed until the fields 404 in the fourth zone Z4, the fifth zone Z5, or the $N^{th}$ zone are all exposed. In other words, the wafer alignment and the lithography exposure are performed zone-by-zone until an $N^{th}$ wafer alignment is performed for the $N^{th}$ zone Zn according to the $N^{th}$ compensation values and an $N^{th}$ lithography exposure is performed on the resist layer 402 over the $N^{th}$ zone Zn, according to operation 208.

In some embodiments, when a topographical variation of the wafer 400 is less than the predetermined value (e.g., 2 nm), the edge zone $Z_E$ is defined, alignment marks in the fields 404 in the edge zone $Z_E$ are detected, and the single-zone alignment compensation is performed to obtain the plurality of compensation values. Notably, the wafer alignment for each field 404 of the whole wafer 400 is performed according to the plurality of compensation values obtained from the single-zone alignment compensation, which is based on the edge zone $Z_E$. Further, lithography exposure for each field 404 can be performed after the wafer alignment.

In some embodiments, when a topographical variation of the wafer 400 is greater than the predetermined value (e.g., 2 nm), the plurality of zones (i.e., Z to Z5, or Z1 to Zn) is defined, alignment marks in the fields 404 in each zone are detected, and the multi-zone alignment compensation is performed to obtain the first to $N^{th}$ compensation values. Notably, a sequence including the wafer alignment and the lithography exposure for the fields 404 in different zones are performed zone-by-zone.

As mentioned above, in some embodiments, the wafer alignment and exposure are performed in sequence for the fields 404 for the first zone Z1 to the $N^{th}$ zone Zn after the multi-zone compensation for all zones (i.e., Z to Z5, or Z1 to Zn) is performed, but the disclosure is not limited thereto. In some embodiments, a multi-zone compensation for the first zone Z1 is performed, and a first wafer alignment and a first exposure are performed for the fields 404 in the first zone Z in sequence after the multi-zone compensation for the first zone Z1. The multi-zone compensation for the second zone Z2 is performed, and a second wafer alignment and a second exposure are performed in sequence for the fields 404 in the second zone Z2 after the multi-zone compensation for the second zone Z2. Similarly, the multi-zone compensation for the $N^{th}$ zone Zn is performed, and an $N^{th}$ wafer alignment and an $N^{th}$ exposure are performed in sequence for the fields 404 in the $N^{th}$ zone Zn after the multi-zone compensation for the $N^{th}$ zone Zn. In other words, the multi-zone compensation, the wafer alignment, and the exposure can be performed in sequence for the fields zone-by-zone.

Figure 10:
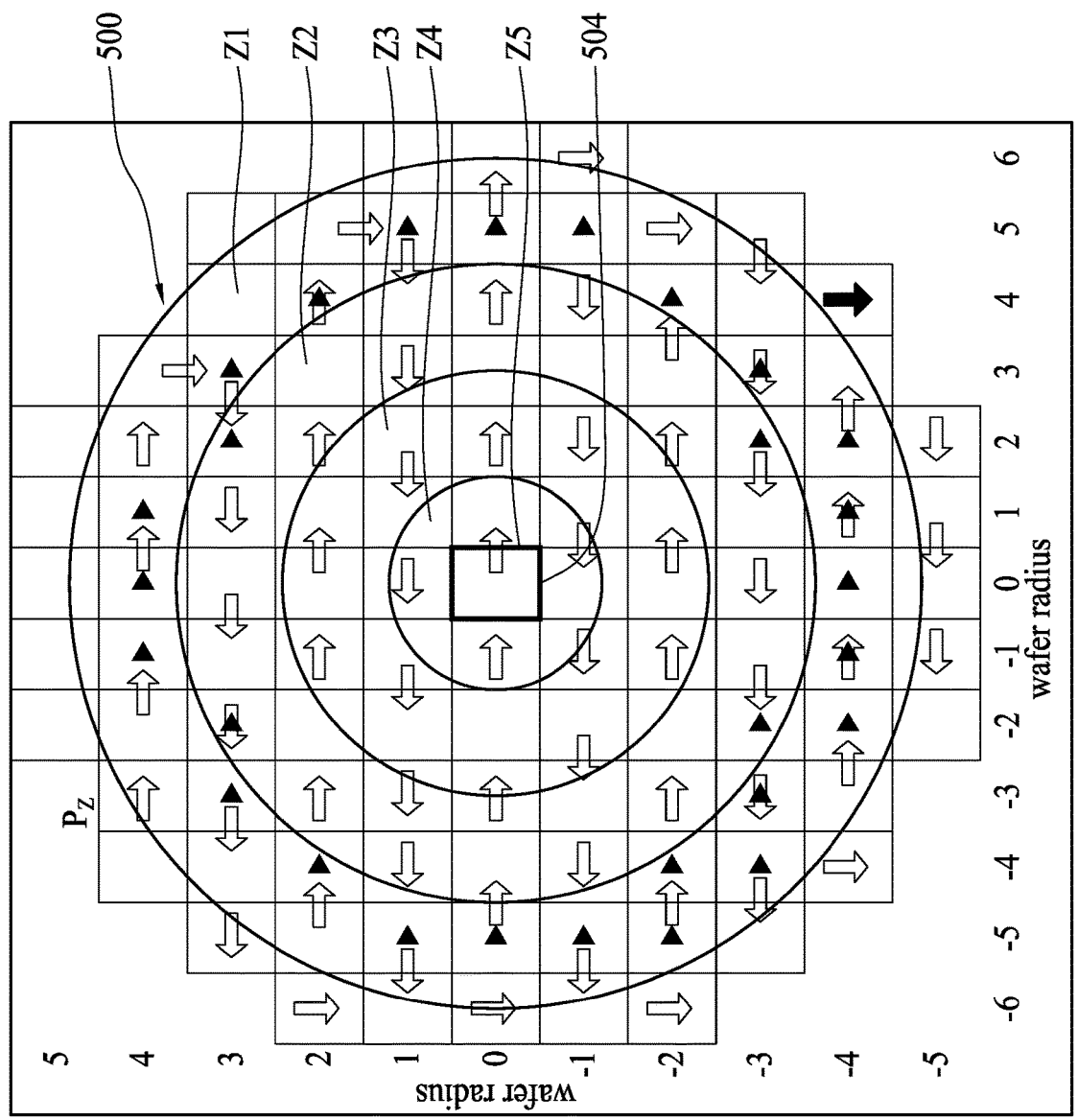
FIG. 10 is a top view of a wafer 500 in accordance with some embodiments.

FIG. 10 is a top view of a wafer in accordance with some embodiments. In some other embodiments, when a topography variation of the wafer is greater than the predetermined value, a plurality of zones, such as the first to the fifth zones Z1 to Z5, are defined over the wafer 500, and each zone include a plurality of fields 504. Alignment marks in the fields in each zone Z to Zn are detected, and the multi-zone alignment compensation is performed to obtain the first to $N^{th}$ compensation. Notably, a wafer alignment and a lithography exposure are sequentially performed for each field 504 along a zig-zag path Pz crossing back and forth across the zones, as shown in FIG. 10. In some embodiment, fields 504 in same row may belongs to different zones; however, the wafer alignment is performed according to the $N^{th}$ compensation value for different zones, and the lithography exposure is performed next.

It should be noted that when the topographical variation of the wafer 400 is greater than the predetermined value, the topography of the wafer 400 may render different influences on different zones of the wafer 400. Therefore, the first zone Z1 to the $N^{th}$ zone Zn (e.g., the fifth zone Z5) are defined and the wafer alignments are performed zone-by-zone according to the first compensation values to the $N^{th}$ compensation values. Accordingly, influences on different zones are compensated, and thus overlay accuracy is ensured.

In some embodiments, after the lithography exposure, the resist layer 402 is developed such that patterns are transferred from the photo mask to the resist layer 402, and then transferred to the material layer by layer etching. Such operations can be referred to as lithography patterning. Accordingly, patterns and alignment marks can be formed in the patterned material layer, and overlay accuracy between the patterned material layer and its underlying patterned material layer can be measured by an overlay tool. In some embodiments, the overlay tool measures the deviation between the alignment marks in the two layers, and such measurement data can be stored in a database. In some embodiments, such measuring data can be used in the multi-zone alignment compensation for the lithography operation for the next layer.

Further, an alignment residual ($\Delta(m+3s)$) can be calculated using the measurement data. The alignment residual is calculated based on misalignment between each alignment mark and its previously formed alignment mark. It is found that the alignment residual is reduced to less than, for example but not limited to, 4 nm, according to the present lithographic overlay correction method. It is concluded the overlay correction is improved, and the wafer 400 can be transferred to a next operation.

Accordingly, the present disclosure provides a lithographic overlay correction method and lithography operation that is able to mitigate overlay variation and improve wafer alignment by zones. In some embodiments, different compensation models (i.e., the single-zone model and the multi-zone model) are provided according to the topographical variation of the wafer, thus the wafer alignment can be performed efficiently and accurately. In some embodiments, multi-zone alignment compensation including models with different weightings is performed for different zones, thus overlay residuals in the fields in each zone can be reduced. In other words, overlay residual of the whole wafer is reduced. Consequently, overlay between successive layers formed by the lithography patterning is improved.

In some embodiments, a method is provided. The method includes the following operations. A wafer is received. A surface topography of the wafer is measured. A topographical variation is calculated based on the surface topography measurement. A single-zone alignment compensation is performed when the topographical variation is less than a predetermined value. Alternatively, a multi-zone alignment compensation is performed when the topographical variation is greater than the predetermined value. A wafer alignment is performed according to the single-alignment compensation or the multi-zone alignment compensation.

In some embodiments, a method is provided. A wafer is received. A topographical variation is calculated based on a surface topography of the wafer. A single-zone alignment compensation is performed when the topographical variation is less than a predetermined value. Alternatively, a multi-zone alignment compensation is performed when the topographical variation is greater than the predetermined value.

In some embodiments, a method is provided. A wafer is received. A surface topography of the wafer is measured. A topographical variation is calculated based on the surface topography measurement. A single-zone alignment compensation is performed when the topographical variation is less than a predetermined value. Alternatively, a multi-zone alignment compensation is performed when the topographical variation is greater than the predetermined value. A wafer alignment is performed according to the single-zone alignment compensation or the multi-zone alignment compensation. In some embodiments, the single-zone compensation further includes following operations. An edge zone is defined over the wafer. In some embodiments, the edge zone includes a plurality of fields. The single-zone alignment compensation is performed by a controller for the edge zone. In some embodiments, the multi-zone alignment compensation includes following operations. A plurality of zones are defined over the wafer. In some embodiments, the plurality of zones include a first zone, a second zone and an $N^{th}$ zone. Each of the first zone, the second zone and the $N^{th}$ zone includes a plurality of fields. A first multi-zone alignment compensation is performed by the controller to obtain a first compensation value for the fields in the first zone. A second multi-zone alignment compensation is performed by the controller to obtain a second compensation value for the fields in the second zone.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   receiving a wafer;
   measuring a surface topography of the wafer;
   calculating a topographical variation based on the surface topography measurement;
   performing a single-zone alignment compensation when the topographical variation is less than a predetermined value, or performing a multi-zone alignment compensation when the topographical variation is greater than the predetermined value; and
   performing a wafer alignment according to the single-zone alignment compensation or the multi-zone alignment compensation,
   wherein the multi-zone alignment compensation further comprises:
   defining a plurality of zones over the wafer, wherein each zone includes a plurality of fields; and
   performing the multi-zone alignment compensation for each of the plurality of zones by a controller according to an equation (1),
   wherein the equation (1) is:

$$dXm = \alpha_m * Z1 + \beta_m * Z2 + \gamma_m * Z3 + \ldots \omega_m * Zn \qquad (1)$$

wherein n is a positive integer greater than 1, m indicates that the zone undergoes the multi-zone alignment compensation and m is a positive integer less than or equal to n, dXm indicates the compensation value to be adjusted during the wafer alignment, Z1 to Zn indicate a first zone to an Nth zone of the plurality of zones, $\alpha_m$ indicates a weighting for the fields in the first zone during performing of the multi-zone alignment compensation for an mth zone, $\beta_m$ indicates a weighting for the fields in the second zone during performing of the multi-zone alignment compensation for the mth zone, $\gamma_m$ indicates a weighting for the fields in the third zone during performing of the multi-zone alignment compensation for the mth zone, and $\omega_m$ indicates a weighting for the fields in the Nth zone during performing of the multi-zone alignment compensation for the mth zone.

2. The method of claim 1, wherein the predetermined value is equal to or less than 2 nanometer (nm).

3. The method of claim 1, wherein the single-zone alignment compensation and the multi-zone alignment compensation are each performed along both an x direction and a y direction.

4. The method of claim 1, wherein the single-zone alignment compensation further comprises:

defining an edge zone over the wafer, wherein the edge zone includes a plurality of fields; and
performing the single-zone alignment compensation for the edge zone.

5. The method of claim 1, wherein when the weighting includes m being equal to n, such weighting value is greater than other weighting values.

6. The method of claim 1, further comprising performing an exposure after the wafer alignment.

7. The method of claim 6, wherein the wafer alignment and the exposure are performed in sequence for the fields zone-by-zone.

8. A method comprising:
   receiving a wafer;
   calculating a topographical variation based on a surface topography of the wafer; and
   determining to perform a single-zone alignment compensation when the topographical variation is less than a predetermined value, and, alternatively, to perform a multi-zone alignment compensation when the topographical variation is greater than the predetermined value;
   performing a wafer alignment according to the single-zone alignment compensation or the multi-zone alignment compensation; and
   performing an exposure after the wafer alignment,
   wherein the multi-zone alignment compensation further comprises:
   defining a plurality of zones over the wafer, wherein the plurality of zones includes a first zone, a second zone and an $N^{th}$ zone, and each of the first zone, the second zone and the $N^{th}$ zone includes a plurality of fields;
   performing a first multi-zone alignment compensation by a controller to obtain a first compensation value for the fields in the first zone, wherein the first multi-zone alignment compensation includes an equation (1), and the equation (1) is:

$$dX1 = \alpha_1 * Z1 + \beta_1 * Z2 + \gamma_1 * Z3 + \ldots \omega_1 * Zn \qquad (1)$$

wherein dX1 indicates the first compensation value for the fields in the first zone, Z1 to Zn indicate the first zone to the $N^{th}$ zone of the plurality of zones, $\alpha_1$ indicates a weighting for the fields in the first zone in the first multi-zone alignment compensation, $\beta_1$ indicates a weighting for the fields in the second zone in the first multi-zone alignment compensation, $\gamma_1$ indicates a weighting for the fields in the third zone in the first multi-zone alignment compensation, and $\omega_1$ indicates a weighting for the fields in the $N^{th}$ zone in the first multi-zone alignment compensation; and
   performing a second multi-zone alignment compensation by the controller to obtain a second compensation value for the fields in the second zone, wherein the second multi-zone alignment compensation includes an equation (2), and the equation (2) is:

$$dX2 = \alpha_2 * Z1 + \beta_2 * Z2 + \gamma_2 * Z3 + \ldots \omega_2 * Zn \qquad (2)$$

wherein dX2 indicates the second compensation value for the fields in the second zone, $\alpha 2$ indicates a weighting for the fields in the first zone in the second multi-zone alignment compensation, $\beta 2$ indicates a weighting for the fields in the second zone in the second multi-zone alignment compensation, $\gamma 2$ indicates a weighting for the fields in the third zone in the second multi-zone alignment compensation, and $\omega 2$ indicates a weighting for the fields in the Nth zone in the second multi-zone alignment compensation.

9. The method of claim 8, wherein the predetermined value is equal to or less than 2 nanometer (nm).

10. The method of claim 8, wherein the single-zone alignment compensation and the multi-zone alignment compensation are each performed along both an x direction and a y direction.

11. The method of claim 8, wherein the single-zone alignment compensation further comprises:
defining an edge zone over the wafer, wherein the edge zone includes a plurality of fields; and
performing the single-zone alignment compensation for the edge zone.

12. The method of claim 8, wherein $\alpha_1$ is greater than $\beta_1$, $\gamma_1$ and $\omega_1$ in the first multi-zone alignment compensation, and $\beta_2$ is greater than $\alpha_2$, $\gamma_2$ and $\omega_2$ in the second multi-zone alignment compensation.

13. The method of claim 8, wherein the zones are arranged in concentric circles.

14. A method comprising:
receiving a wafer;
measuring a surface topography of the wafer;
calculating a topographical variation based on the surface topography measurement;
determining to perform a single-zone alignment compensation when the topographical variation is less than a predetermined value, and alternatively, to perform a multi-zone alignment compensation when the topographical variation is greater than the predetermined value; and
performing a wafer alignment according to the single-zone alignment compensation or the multi-zone alignment compensation,
wherein the single-zone alignment compensation further comprises:
defining an edge zone over the wafer, wherein the edge zone includes a plurality of fields; and
performing the single-zone alignment compensation by a controller for the edge zone;
wherein the multi-zone alignment compensation further comprises:
defining a plurality of zones over the wafer, wherein the plurality of zones includes a first zone, a second zone and an $N^{th}$ zone, and each of the first zone, the second zone and the $N^{th}$ zone includes a plurality of fields;
performing a first multi-zone alignment compensation by the controller to obtain a first compensation value for the fields in the first zone, wherein the first multi-zone alignment compensation includes an equation (1), and the equation (1) is:

$$dX1 = \alpha_1 * Z1 + \beta_1 * Z2 + \gamma_1 * Z3 + \ldots \omega_1 * Zn \quad (1)$$

wherein dX1 indicates the first compensation value for the fields in the first zone, Z1 to Zn indicate the first zone to the $N^{th}$ zone of the plurality of zones, $\alpha_1$ indicates a weighting for the fields in the first zone in the first multi-zone alignment compensation, $\beta_1$ indicates a weighting for the fields in the second zone in the first multi-zone alignment compensation, $\gamma_1$ indicates a weighting for the fields in the third zone in the first multi-zone alignment compensation, and $\omega_1$ indicates a weighting for the fields in the $N^{th}$ zone in the first multi-zone alignment compensation; and
performing a second multi-zone alignment compensation by the controller to obtain a second compensation value for the fields in the second zone, wherein the second multi-zone alignment compensation includes an equation (2), and the equation (2) is:

$$dX2 = \alpha_2 * Z1 + \beta_2 * Z2 + \gamma_2 * Z3 + \ldots \omega_2 * Zn \quad (2)$$

wherein dX2 indicates the second compensation value for the fields in the second zone, $\alpha2$ indicates a weighting for the fields in the first zone in the second multi-zone alignment compensation, $\beta2$ indicates a weighting for the fields in the second zone in the second multi-zone alignment compensation, $\gamma2$ indicates a weighting for the fields in the third zone in the second multi-zone alignment compensation, and $\omega2$ indicates a weighting for the fields in the $N^{th}$ zone in the second multi-zone alignment compensation.

15. The method of claim 14, wherein the single-zone alignment compensation and the multi-zone alignment compensation are each performed along both an x direction and a y direction.

16. The method of claim 14, further comprising performing an exposure after the wafer alignment.

17. The method of claim 16, wherein the wafer alignment and the exposure are performed in sequence for the fields zone-by-zone.

18. The method of claim 14, wherein the zones are arranged in concentric circles.

19. The method of claim 14, wherein in the first multi-zone alignment compensation, $\alpha_1$ is greater than $\beta_1$, $\gamma_1$ and $\omega_1$.

20. The method of claim 14, wherein in the second first multi-zone alignment compensation, $\beta_2$ is greater than $\alpha_2$, $\gamma_2$ and $\omega_2$.

* * * * *